(12) United States Patent
Kim et al.

(10) Patent No.: US 11,552,139 B2
(45) Date of Patent: Jan. 10, 2023

(54) DISPLAY DEVICE

(71) Applicant: SAMSUNG DISPLAY CO., LTD., Yongin-si (KR)

(72) Inventors: Jang Il Kim, Asan-si (KR); Jeong Ki Kim, Hwaseong-si (KR); Jong Hoon Kim, Seoul (KR); Jea Heon Ahn, Hwaseong-si (KR); Myoung Jong Lee, Cheonan-si (KR); Seok Joon Hong, Seongnam-si (KR)

(73) Assignee: SAMSUNG DISPLAY CO., LTD., Yongin-Si (KR)

( * ) Notice: Subject to any disclaimer, the term of this patent is extended or adjusted under 35 U.S.C. 154(b) by 90 days.

(21) Appl. No.: 16/698,304

(22) Filed: Nov. 27, 2019

(65) Prior Publication Data
US 2020/0266253 A1    Aug. 20, 2020

(30) Foreign Application Priority Data
Feb. 18, 2019    (KR) .......................... 10-2019-0018750

(51) Int. Cl.
*H01L 27/32*    (2006.01)
*H01L 51/52*    (2006.01)
(52) U.S. Cl.
CPC ...... *H01L 27/3244* (2013.01); *H01L 27/3218* (2013.01); *H01L 51/5284* (2013.01)
(58) Field of Classification Search
CPC ............. H01L 27/3244; H01L 27/3246; H01L 27/3272; H01L 37/3251; H01L 33/505; H01L 33/50; H01L 33/501; H01L 33/502; H01L 33/504; H01L 51/5016; H01L 27/322; H01L 51/5284
See application file for complete search history.

(56) References Cited

U.S. PATENT DOCUMENTS

2009/0294778 A1* 12/2009 Mitsuya .............. H01L 51/5036
257/79
2011/0141413 A1* 6/2011 Sakai ................ G02F 1/136286
349/110
2014/0284575 A1* 9/2014 Sugisawa ............ H01L 51/5218
257/40

(Continued)

FOREIGN PATENT DOCUMENTS

KR    10-2015-0061988    6/2015
WO    WO2015/083823    * 6/2015    .......... H01L 27/3211

*Primary Examiner* — Jesse Y Miyoshi
(74) *Attorney, Agent, or Firm* — F. Chau & Associates, LLC

(57) ABSTRACT

A display device that includes a plurality of pixels arranged in a row direction and a column direction crossing the row direction. The display device includes a first substrate including light-emitting elements each disposed in the respective pixels. A second substrate faces the first substrate. A plurality of optical patterns are disposed on the second substrate in pixel columns, respectively, and extend along the column direction. Light-blocking patterns are disposed on the second substrate. The light-blocking patterns include a main light-blocking pattern extending along pixel column boundaries and fill spaces between adjacent optical patterns, and a subsidiary light-blocking pattern disposed on the optical patterns at pixel row boundaries and having a thickness smaller than a thickness of the main light-blocking pattern.

15 Claims, 20 Drawing Sheets

(56) References Cited

U.S. PATENT DOCUMENTS

| | | | |
|---|---|---|---|
| 2014/0306241 A1* | 10/2014 | Hirakata | H01L 27/322 257/79 |
| 2015/0362776 A1* | 12/2015 | Jikumaru | G02F 1/133553 349/12 |
| 2017/0062528 A1* | 3/2017 | Aoyama | H01L 27/3246 |

* cited by examiner

DISPLAY DEVICE

This application claims priority under 35 U.S.C. § 119 to Korean Patent Application No. 10-2019-0018750, filed on Feb. 18, 2019 in the Korean Intellectual Property Office, the disclosure of which is incorporated by reference in its entirety herein.

1. TECHNICAL FIELD

The present disclosure relates to a display device.

2. DISCUSSION OF RELATED ART

Display devices have become increasingly important as multimedia technology has evolved. Accordingly, a variety of display devices such as liquid-crystal display devices (LCDs) and organic light-emitting diode display devices (OLEDs) are currently being developed.

Among display devices, an organic light-emitting display device includes organic light-emitting elements which are self-luminous elements. An organic light-emitting element may include two opposing electrodes and an organic emissive layer interposed therebetween. Electrons and holes supplied from the two electrodes are recombined in the emissive layer to generate excitons. The generated excitons relax from an excited state to a ground state which results in the emission of light.

An organic light-emitting display device does not require a separate light source. Therefore, organic light-emitting display devices consume less power and may be made relatively light and thin. Organic light-emitting display devices also exhibit high-quality characteristics such as a wide viewing angle, high luminance and contrast, and a fast response speed. Accordingly, organic light-emitting display devices are attracting attention as a display device.

SUMMARY

Aspects of the present disclosure provide a display device capable of improving color mixture of light emitted from a light-emitting element of each pixel as well as color mixture of light emitted from each optical pattern layer.

These and other aspects, embodiments and advantages of the present disclosure will become immediately apparent to those of ordinary skill in the art upon review of the Detailed Description and Claims to follow.

According to an exemplary embodiment of the present disclosure, color mixture of light emitted from a light-emitting element of each pixel as well as color mixture of light emitted from each optical pattern layer may be improved.

It should be noted that effects of the present disclosure are not limited to those described above and other effects of the present disclosure will be apparent to those skilled in the art from the following descriptions.

According to an exemplary embodiment of the disclosure, a display device includes a plurality of pixels. A first substrate includes light-emitting elements disposed in the plurality of pixels. A second substrate faces the first substrate. A plurality of optical patterns is disposed on the second substrate and extends along in a first direction. Light-blocking patterns are disposed on the second substrate. The light-blocking patterns comprise a main light-blocking pattern disposed in spaces between adjacent optical patterns, and a subsidiary light-blocking pattern disposed on the optical patterns and having a thickness smaller than a thickness of the main light-blocking pattern.

According to an exemplary embodiment of the disclosure, a display device having a plurality of pixels arranged in a row direction and a column direction crossing the row direction includes a first substrate having light-emitting elements disposed in the pixels. A second substrate faces the first substrate. A plurality of optical patterns is disposed on the second substrate in pixel columns and extends along a column direction. Light-blocking patterns are disposed on the second substrate and extend along pixel column boundaries. The light-blocking patterns are disposed between adjacent optical patterns and are configured to fill spaces therebetween.

According to an exemplary embodiment of the disclosure, a method for manufacturing a display device includes forming a light-providing unit having a first substrate including light-emitting elements disposed in a plurality of pixels. A light-converting unit is formed that includes a second substrate, a plurality of optical patterns disposed on the second substrate and light-blocking patterns disposed on the second substrate. The light-blocking patterns include a main light-blocking pattern disposed in spaces between adjacent optical patterns. The main light-blocking pattern is configured to protrude from a surface of the optical patterns in a thickness direction. A filler is deposited on the second substrate of the light-converting unit. The light-providing unit is attached to the light-converting unit. The protrusions of the main light-blocking pattern are configured to maintain a gap having a minimum thickness between the light-providing unit and the light-converting unit to prevent contact between the light-providing unit and the light-converting unit.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EXEMPLARY EMBODIMENTS

The present invention will now be described more fully hereinafter with reference to the accompanying drawings, in which preferred embodiments of the invention are shown. This invention may, however, be embodied in different forms and should not be construed as limited to the exemplary embodiments set forth herein.

It will also be understood that when a layer is referred to as being "on" another layer or substrate, it can be directly on the other layer or substrate, or intervening layers may also be present. The same reference numbers indicate the same components throughout the specification.

Hereinafter, exemplary embodiments of the present disclosure will be described in detail with reference to the accompanying drawings.

Figure 1:
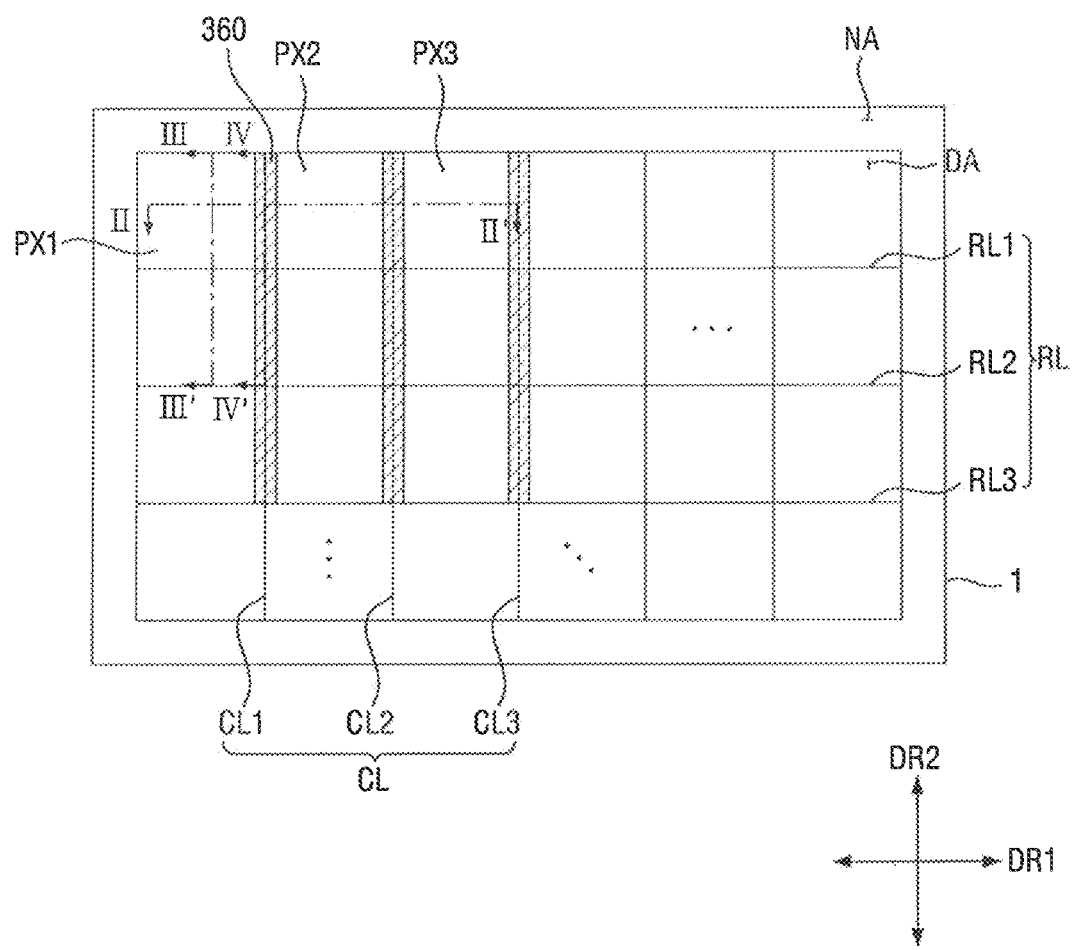
FIG. 1 is a plan view showing a layout of pixels and a light-blocking pattern of a display device according to an exemplary embodiment of the present inventive concepts.
Figure 2:
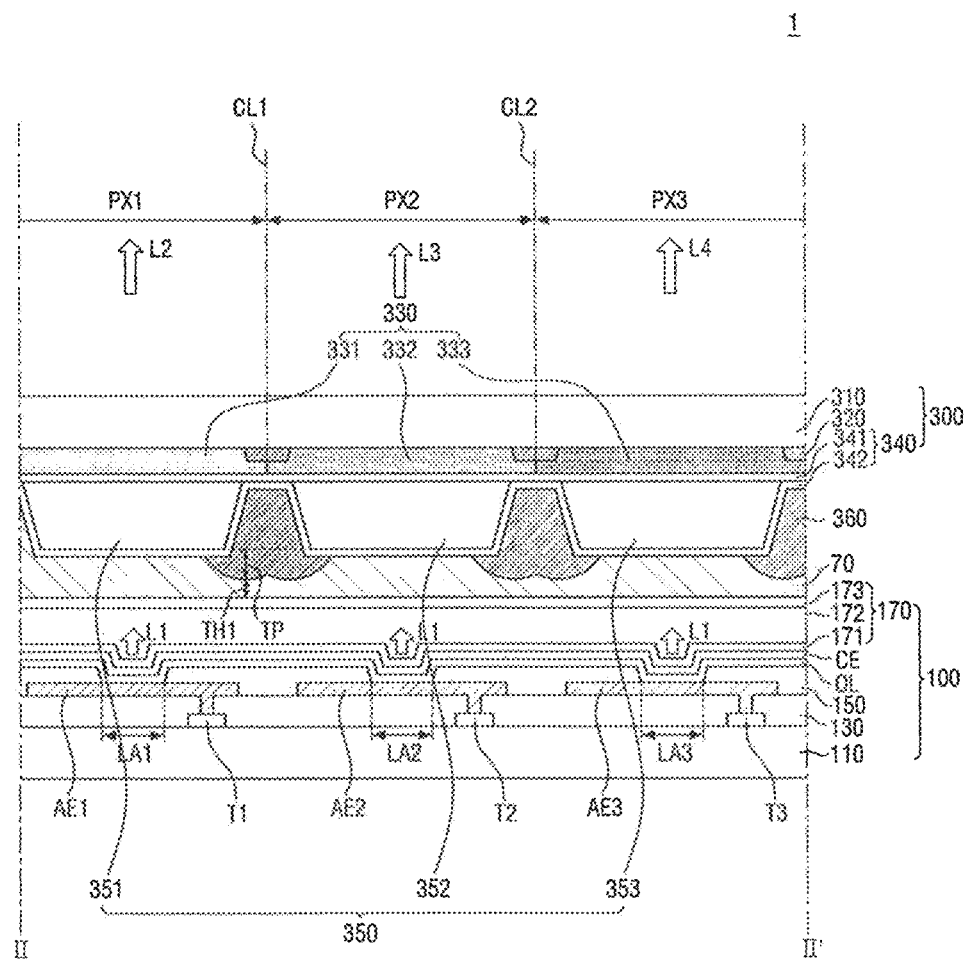
FIG. 2 is a cross-sectional view of the display device taken along line II-II' of FIG. 1 according to an exemplary embodiment of the present inventive concepts.
Figure 3:
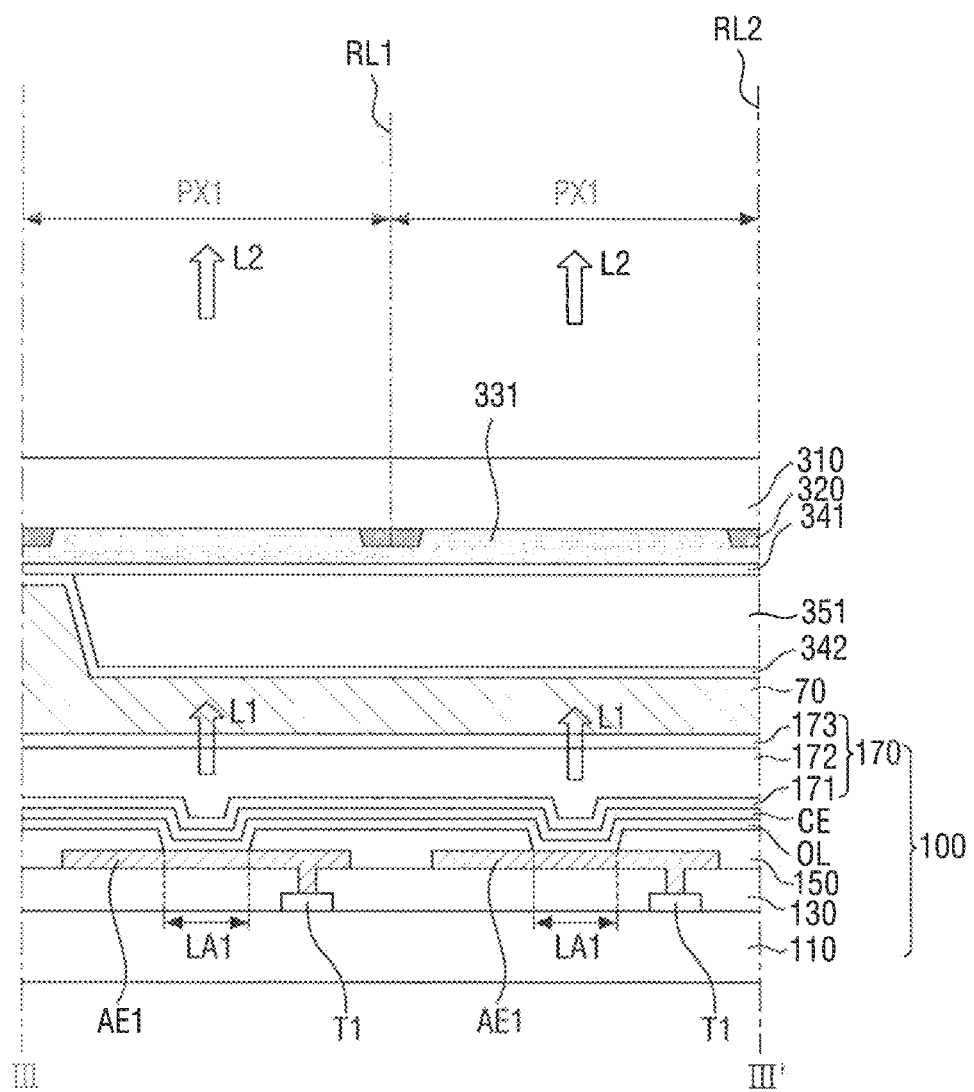
FIG. 3 is a cross-sectional view of the display device taken along line III-III' of FIG. 1 according to an exemplary embodiment of the present inventive concepts.
Figure 4:
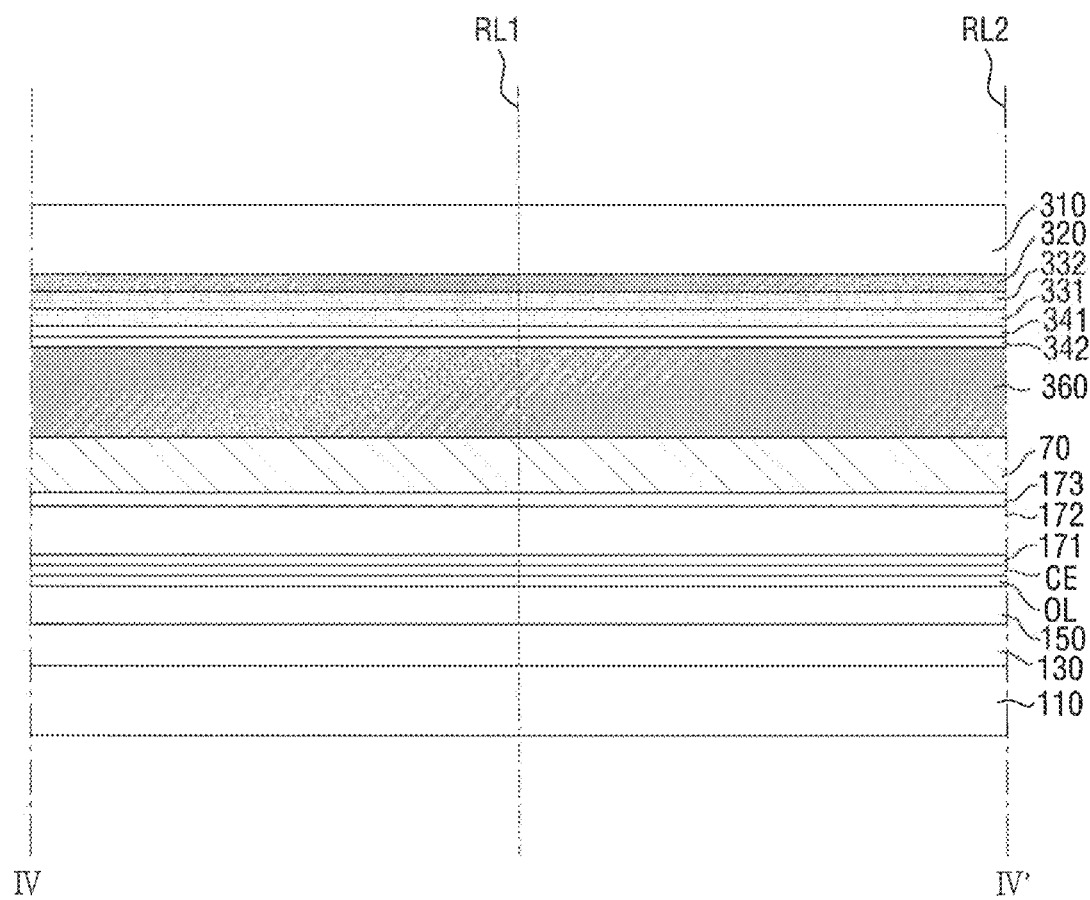
FIG. 4 is a cross-sectional view of the display device taken along line IV-IV' of FIG. 1 according to an exemplary embodiment of the present inventive concepts.
Figure 5:
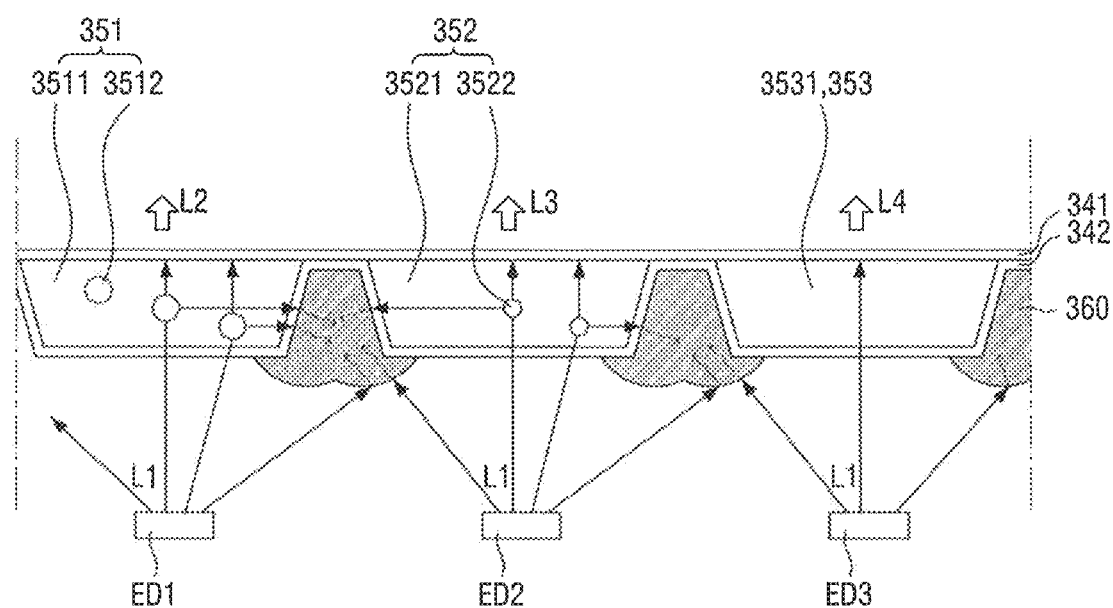
FIG. 5 is a cross-sectional view illustrating the blocking of light by a light-blocking pattern according to an exemplary embodiment of the present inventive concepts.

FIG. 1 is a plan view showing a layout of pixels and a light-blocking pattern of a display device. FIG. 2 is a cross-sectional view of the display device according to an exemplary embodiment of the present inventive concepts taken along line II-II' of FIG. 1. FIG. 3 is a cross-sectional view of the display device according to an exemplary embodiment of the present inventive concepts taken along line III-III' of FIG. 1. FIG. 4 is a cross-sectional view of the display device according to an exemplary embodiment of the present inventive concepts taken along line IV-IV' of FIG. 1. FIG. 5 is a cross-sectional view illustrating the blocking of light by a light-blocking pattern according to an exemplary embodiment of the present inventive concepts.

Referring to FIGS. 1 to 5, according to exemplary embodiments of the present inventive concepts a display device may include an organic light-emitting display device, a liquid-crystal display device, a quantum-dot nano-cell emission display device, a micro LED) device, a field emission display device, an electrophoresis display device, etc. In the exemplary embodiment shown in FIG. 1, an organic light-emitting display device is employed as the display device 1.

As shown in FIG. 1, the display device 1 may include a display area DA where images are displayed, and a non-display area NA where image are not displayed.

In an exemplary embodiment, the display area DA may be disposed in the center portion of the display device 1. The display area DA may include a plurality of pixels. The plurality of pixels may be arranged in a matrix. The pixels may include first pixels PX1 for representing a first color, second pixels PX2 for representing a second color, and third pixels PX3 for representing a third color. For example, the first pixels PX1 may be red pixels that emit red light having a peak wavelength in the range of approximately 610 to 650 nm. The second pixels PX2 may be green pixels that emit green light having a peak wavelength in the range of approximately 510 to 550 nm. The third pixels PX3 may be blue pixels that emit blue light having a peak wavelength in the range of approximately 430 to 470 nm. However, the first pixels PX1, second pixels PX2 and third pixels PX3 may be configured to emit various other colors in other exemplary embodiments.

The first pixels PX1, the second pixels PX2 and the third pixels PX3 may be arranged in stripes (e.g., vertical or horizontal stripes) in the matrix. In one embodiment, pixels belonging to a pixel column may represent the same color. For example, the first pixels PX1 may be arranged in a first pixel column which extends from an edge of the display area DA to a first pixel column boundary CL1. The second pixels PX2 may be arranged in a second pixel column which extends from the first pixel column boundary CL1 to the second pixel column boundary CL2. The third pixels PX3 may be arranged in a third pixel column which extends from the second pixel column boundary CL2 to the third pixel column boundary CL3. Additional pixels of the plurality of pixels may be arranged along the row direction. However, the arrangement of the pixels may vary in other exemplary embodiments of the present inventive concepts.

Light-blocking patterns may be disposed at the boundaries of the pixels. The light-blocking patterns may include a first light-blocking pattern 360 disposed between wavelength-converting layers and a second light-blocking pattern 320 disposed between the color filters. The second light-blocking pattern 320 may be disposed along the pixel row boundaries RL1, RL2 and RL3 and the pixel column boundaries CL1, CL2 and CL3. The first light-blocking pattern 360 may not be disposed along the pixel row boundaries RL1, RL2 and RL3 but only along the pixel column boundaries CL1, CL2 and CL3. The light-blocking patterns will be described in detail later.

Hereinafter, the cross-sectional structure of the display device 1 will be described in more detail with reference to FIGS. 2 to 4.

As shown in FIGS. 2 to 4, the display device 1 may include a light-providing unit 100, a light-converting unit 300, and a filler 70.

The light-providing unit 100 may include a first base substrate 110, switching elements T1, T2 and T3, an insulating layer 130, a bank layer 150, organic light-emitting elements ED1, ED2 and ED3, and a thin encapsulation layer 170.

The first base substrate 110 may be made of a material that transmits light. For example, the first base substrate 110 may be a glass substrate or a plastic substrate.

At least one switching element T1, T2 and T3 may be disposed in each of the pixels PX1, PX2 and PX3 on the first base substrate 110. Further, a plurality of signal lines (for example, gate lines, data lines, power lines, etc.) for transmitting signals to the switching elements T1, 12 and T3 may be further disposed on the first base substrate 110.

The insulating layer 130 may be disposed over the switching elements T1, T2, and T3. The insulating layer 130 may be formed of an organic layer. For example, the insulating layer 130 may include an acrylic resin, an epoxy resin, an imide resin, an ester resin, etc.

The pixel electrodes AE1, AE2 and AE3 may be disposed on the insulating layer 130 in the pixels PX1, PX2 and PX3, respectively. The pixel electrodes AE1, AE2 and AE3 may be connected to the switching elements T1, T2 and T3, respectively, through via holes passing through the insulating layer 130.

In an exemplary embodiment, each of the pixel electrodes AE1, AE2 and AE3 may be the anode electrode of the respective organic light-emitting emitting element. The pixel electrodes AE1, AE2 and AE3 may include a material having a high work function for easy injection of holes. For example, the pixel electrodes AE1, AE2, AE3 may include a material such as indium-tin-oxide (ITO), indium-zinc-oxide (IZO), zinc oxide (ZnO) and indium oxide ($In_2O_3$). For a top-emission display device, the pixel electrodes AE1, AE2 and AE3 may further include a reflective material layer.

The bank layer 150 may be disposed over the pixel electrodes AE1, AE2 and AE3. The bank layer 150 may be formed in a lattice shape extended along the pixel column boundaries CL1 and CL2 and the pixel row boundaries RL1 and RL2. In addition, the bank layer 150 may include openings that partially expose the pixel electrodes AE1, AE2 and AE3. The portions of the pixel electrodes AE1, AE2 and AE3 which are not covered by the bank layer 150 but are exposed may be the emission areas LA1, LA2 and LA3, respectively. The other portions covered by the bank layer 150 may be the non-emission areas. The bank layer 150 may be made of a material including an organic insulating material.

An organic layer OL may be disposed on the portions of the pixel electrodes AE1, AE2 and AE3 exposed via the openings of the bank layer 150. Although the organic layer OL is shown as a single piece extending across the pixels, the organic layer OL may be formed separately in each of the pixels PX1, PX2 and PX3 and may not be continuous.

The organic layer OL may include an organic emissive layer. Holes supplied from the anode electrode and electrons supplied from the cathode electrode may recombine in the organic emissive layer to generate excitons. The generated excitons relax from the excited state to the ground state and accordingly blue light L may be emitted. The organic layer OL may further include an auxiliary layer that assists injection/movement of holes and electrons.

A common electrode CE may be disposed on the organic layer OL. In embodiments where each of the pixel electrodes AE1, AE2 and AE3 is the anode electrode of the respective organic light-emitting element, the common electrode CE may be the cathode electrode of the organic light-emitting element. The common electrode CE may include a material having a low work function to allow easy for injection of electrons. For example, the common electrode CE may include Li, Ca, LiF/Ca, LiF/Al, Al, Mg, Ag, Pt, Pd, Ni, Au, Nd, Ir, Cr, BaF, Ba, etc. or a compound or mixture thereof (e.g., a mixture of Ag and Mg).

The first pixel electrode AE1, the organic layer OL within the first pixel column and the common electrode CE may form a first organic light-emitting element device ED1. The second pixel electrode AE2, the organic layer OL within the second pixel column and the common electrode CE may form a second organic light-emitting element ED2. The third pixel electrode AE3, the organic layer OL within the third pixel column and the common electrode CE may form a third organic light-emitting element ED3.

The blue light L1 emitted from the organic light-emitting elements ED1, ED2 and ED3 arranged in the pixels PX1, PX2 and PX3, respectively, may be provided to such pixels. Furthermore, the light emitted from each of the organic light-emitting elements ED1, ED2 and ED3 may be provided to adjacent pixels.

The thin encapsulation layer 170 may be disposed on the common electrode CE. To prevent impurities or moisture from permeating from the outside, the thin encapsulation layer 170 may be disposed above the organic light-emitting elements to seal the organic light-emitting elements ED1, ED2 and ED3. The thin encapsulation layer 170 may include a first inorganic encapsulation layer 171 containing an inorganic material, a third inorganic encapsulation layer 173 containing an inorganic material, and an organic encapsulation layer 172 disposed therebetween.

Hereinafter, the light-converting unit 300 will be described. The light-converting unit 300 may include a second base substrate 310, a second light-blocking pattern 320, color filters 331, 332 and 333, optical patterns 351, 352 and 353, a plurality of stacked capping layers 341 and 342, and a first light-blocking pattern 360.

The second base substrate 310 faces the first base substrate 110. The second base substrate 310 may be made of a material including at least one material selected from the above-listed materials of the first base substrate 110.

The second light-blocking pattern 320 may be disposed on the surface of the second base substrate 310 that faces the light-providing unit 100 (e.g., the lower side of the second substrate shown in FIG. 4). The second light-blocking pattern 320 may be formed in a lattice shape extended along the pixel column boundaries CL1 and CL2 and the pixel row boundaries RL1 and RL2.

The second light-blocking pattern 320 may block the transmission of light. Specifically, the second light-blocking pattern 320 may prevent the color mixture of light exiting from the pixels PX1, PX2 and PX3 to the display surface. The second light-blocking pattern 320 may include at least one of opaque organic materials, metallic materials including chromium, carbon black, etc.

The color filters 330 may be disposed on a surface of the second base substrate 310. For example, in the exemplary embodiment shown in FIG. 3, the color filters 330 are disposed on a bottom surface of the second base substrate 310. Further, the color filters 330 may be disposed on the second light-blocking pattern 320. The color filters 330 may be absorptive filters that absorb light of a particular wavelength and transmit light of other wavelengths.

The color filters 330 may include first to third color filters 331 to 333. The first to third color filters 331 to 333 may be arranged in stripes. The first to third color filters 331 to 333 may be continuous along the column direction (the second direction DR2). The first color filter 331 may be disposed in the first pixel column, the second color filter 332 may be disposed in the second pixel column, and the third color filter 333 may be disposed in the third pixel column. The color filters 331, 332 and 333 may extend across the pixel row boundaries RL1, RL2 and RL3.

When blue light L1 and red light L2 exit from a first wavelength conversion pattern 351, the first color filter 331 may block or absorb the blue light L1. For example, the first color filter 331 may work as a blue light cutoff filter that blocks blue light and transmits red light L2. The first color filter 331 may include a red colorant.

When blue light L1 and green light L3 exit from a second wavelength conversion pattern 352, the second color filter 332 may block or absorb the blue light L. For example, the second color filter 332 may work as a blue light cutoff filter that blocks blue light and transmits green light L3. The second color filter 332 may include a green colorant.

The third color filter 333 may transmit the blue light L4 exiting from a light transmission pattern 353 to be described later. The third color filter 333 may work as a blue light transmission filter. The third color filter 333 may include a blue colorant.

The adjacent color filters 331, 332 and 333 may partially overlap with one another at the pixel column boundaries CL1, CL2 and CL3, or may be spaced apart from one another so that they do not overlap with one another.

The first capping layer 341 may be disposed on the color filters. The first capping layer 341 may be disposed on the entire surface of the color filters 331, 332 and 333.

The first capping layer 341 may prevent impurities such as moisture and air from permeating from the outside to damage or contaminate the color filters 331, 332 and 333.

The first capping layer 341 may be made of an inorganic material. For example, the first capping layer 341 may be made of a material including silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, etc.

Optical patterns 350 may be disposed on the first capping layer 341. The optical patterns 350 may include a first wavelength conversion pattern 351, a second wavelength conversion pattern 352, and a light transmission pattern 353.

In an exemplary embodiment, the blue light L1 incident on the first wavelength conversion pattern 351 may be converted into red light L2 to exit. The blue light L1 incident on the second wavelength conversion pattern 352 may be converted into green light L3 to exit. The blue light 11 incident on the light transmission pattern 351 may exit as blue light without a wavelength conversion.

Referring to FIG. 5, the first wavelength conversion pattern 351 may include a first base resin 3511 and first wavelength-converting particles 3512 dispersed in the first base resin 3511. The second wavelength conversion pattern 352 may include a second base resin 3521 and second wavelength-converting particles 3522 dispersed in the second base resin 3521. The light transmission pattern 353 may include a third base resin 3531 and may not include wavelength-converting particles. The optical patterns 351, 352 and 353 may further include scattering particles dispersed in the base resins 3511, 3521, and 3531, respectively. For example, the scattering particles may be metal oxide particles such as titanium oxide ($TiO_2$), silicon oxide ($SiO_2$), zirconium oxide ($ZrO_2$), aluminum oxide ($Al_2O_3$), indium oxide ($In_2O_3$), zinc oxide (ZnO) and tin oxide ($SnO_2$), or an organic resin such as an acrylic resin and a urethane resin.

It should be noted that the material of the base resins 3511, 3521 and 3531 is not particularly limited as long as it has a high light transmittance and the wavelength-converting particles 3512 and 3522 and the scattering particles can be dispersed well therein. For example, each of the base resins 3511, 3521 and 3531 may include an organic material such as an epoxy resin, an acrylic resin, a cardo resin and an imide resin.

The first wavelength-converting particles 3512 may convert the blue light L1 into the red light L2. The second wavelength-converting particles 3522 may convert the blue light L1 into the green light L3. Examples of the wavelength-converting particles 3512 and 3522 may include quantum dots, quantum rods or phosphors. For example, quantum dots may be particulate matter that emits a color as electrons transition from the conduction band to the valence band. When both of the first wavelength-converting particles 3512 and the second wavelength-converting particles 3522 are formed of quantum dots, the diameter of the quantum dots forming the first wavelength-converting particles 3512 may be larger than the diameter of the quantum dots forming the second wavelength-converting particles 3522.

The quantum dots may be semiconductor nanocrystalline material. The quantum dots may have a specific band gap depending on their compositions and size, and can absorb light and emit light having an intrinsic wavelength. Examples of the semiconductor nanocrystals of the quantum dots may include Group IV nanocrystals, Groups II-VI compound nanocrystals, Groups III-V compound nanocrystals, Groups IV-VI nanocrystals, or combinations thereof. The quantum dots may have a core-shell structure including a core comprising the nanocrystals and a shell surrounding the core.

The optical patterns 351, 352 and 353 may be arranged in stripes. The first wavelength conversion pattern 351, the second wavelength conversion pattern 352 and the light transmission pattern 353 may be continuous along the column direction (the second direction DR2), like the color filters 330. The first wavelength conversion pattern 351 may be disposed in the first pixel column, the second wavelength conversion pattern 352 may be disposed in the second pixel column, and the light transmission pattern 353 may be disposed in the third pixel column. The optical patterns 351, 352 and 353 extend across the pixel row boundaries RL1, RL2 and RL3 arranged in the column direction.

In addition, the optical patterns 351, 352 and 353 may protrude in the thickness direction (e.g., the downward direction in FIG. 4). The thickness of each of the optical patterns 351, 352 and 353 may be approximately 3 to 15 µm.

The optical patterns 351, 352 and 353 may be disposed in the pixels PX1, PX2 and PX3, respectively, when viewed from the top. For example, the size of each of the optical patterns 351, 352 and 353 may be smaller than the size of the respective pixels PX1, PX2 and PX3 when viewed from the top. As a result, the optical patterns 351, 352 and 353 may be spaced apart from one another with respect to the pixel column boundaries CL1 and CL2.

There may be a level difference between the areas where the optical patterns 351, 352 and 353 are disposed and the areas where the optical patterns are not disposed (hereinafter referred to as in-between areas), which may be equal to the protruding height of the optical patterns 351, 352 and 353.

The second capping layer 342 may be disposed on the optical patterns 350. The second capping layer 342 may cover the optical patterns 351, 352 and 353.

The second capping layer 342 may include an inorganic material. The second capping layer 342 may be made of the same material as the first capping layer 341 or may include one of those listed above as the materials of the first capping layer 341.

The first light-blocking pattern 360 may be disposed on the second capping layer 342.

The first light-blocking pattern 360 may include at least one of the materials listed above as the material of the second light-blocking pattern 320. For example, the first light-blocking pattern 360 may be formed of an opaque organic material.

The lines of the first light-blocking pattern 360 may be arranged in stripes, like the optical patterns 351, 352, and 353. The first light-blocking pattern 360 may be integrally formed along the pixel column boundaries CL and CL2. The first light-blocking pattern 360 may be a main light-blocking pattern disposed between the optical patterns 351, 352 and 353 to prevent light mixing between them.

The first light-blocking pattern 360 may overlap with the second light-blocking pattern 320 in the thickness direction. For example, the first light-blocking pattern 360 may overlap with the second light-blocking pattern 320 at the pixel column boundaries CL1, CL2 and CL3. The width of the first light-blocking pattern 360 may be greater than the width of the second light-blocking pattern 320 when viewed from the top.

Specifically, the first light-blocking pattern 360 may be disposed between the adjacent ones of the optical patterns 351, 352 and 353 so that the first light-blocking pattern 360 may fill the space between the optical patterns 351, 352 and 353. Further, as shown in FIG. 2, the first light-blocking pattern 360 may extend to a surface of the adjacent optical patterns 351, 352 and 353.

Further, the first light-blocking pattern 360 may protrude in the thickness direction (for example, the downward direction in FIG. 2) from the surface of the optical patterns 351, 352 and 353. The maximum protruding thickness TP of the first light-blocking pattern 360 from the surface of each of the optical patterns 351, 352 and 353 may be approximately 1 to 5 μm.

As described above, the first light-blocking pattern 360 may be disposed at the boundaries between adjacent ones of the pixels to prevent the color mixture of light between the pixels PX1, PX2 and PX3. While the first light-blocking pattern 360 is shown in the exemplary embodiment to be arranged along pixel column boundaries, in other exemplary embodiments in accordance with the present inventive concepts, the pixels and optical patterns may have various other arrangements and the first light-blocking pattern that is disposed between the optical patterns 350 may have another arrangement other than being positioned along pixel column boundaries (e.g., disposed along pixel row boundaries, etc.).

A more detailed description thereon will be given with reference to FIG. 5. The blue light L1 emitted from each of the organic light-emitting elements ED1, ED2 and ED3 may travel in the upward direction of the respective pixels PX1, PX2 and PX3 of the display device. However, the blue light L1 may also travel in the side direction toward the adjacent pixels PX1, PX2 and PX3 as shown in FIG. 5. When this happens, the light emitted from each of the organic light-emitting elements ED1, ED2 and ED3 may be provided also to the optical patterns 351, 352, and 353 of the adjacent pixels, which causes unwanted adjacent pixels to emit light due to the leakage current.

In contrast, in the display device 1 according to the exemplary embodiment of the present disclosure, the first light-blocking pattern 360 may be disposed between adjacent ones of the optical patterns 351, 352 and 353 so that the spaces between them are filled with the first light blocking pattern and may protrude in the thickness direction (for example, the downward direction of FIG. 2) from the surface of the optical patterns 351, 352 and 353. As a result, the light emitted from each of the organic light-emitting elements ED1, ED2 and ED3 may be prevented from traveling in the side direction to reach the adjacent pixels.

On the other hand, when the optical patterns 351, 352 and 353 include the wavelength-converted light and/or the scattering particles, the scattered light may travel in the side direction toward the adjacent pixels PX1, PX2 and PX3 as well as in the upward direction of the pixels PX1, PX2, and PX3, as shown in FIG. 5. When this happens, the colors of the pixels PX1, PX2 and PX3 are mixed and the color purity of each of the pixels PX1, PX2 and PX3 may be lowered.

The first light-blocking pattern 360 disposed between the optical patterns 351, 352 and 353 may block the wavelength-converted light and/or scattered light travelling in the side direction and prevent the light from reaching adjacent pixels PX1, PX2 and PX3. As a result, it possible to prevent the color purity from being lowered due to the adjacent pixels PX1, PX2, and PX3.

The first light-blocking pattern 360 may maintain the gap between the light-providing unit 100 and the light-converting unit 300.

Specifically, during a process of attaching the light-providing unit 100 and the light-converting unit 300 together, e.g., attaching the light-providing unit 100 to the light-converting unit 300 where the filler 70 is formed, it is desired that the units are attached together while the gap between the light-converting unit 300 and the light-providing unit 100 is maintained equal to the thickness of the filler 70 (which is to be described later) to protect elements of the light-providing unit 100 and the light-converting unit 300 that are vulnerable to shock, e.g., the optical patterns 351, 352 and 353, the organic light-emitting elements ED1, ED2 and ED3.

The filler 70 disposed between the light-providing unit 100 and the light-converting unit 300 may be formed of a gel having micro fluidity as described later. A process of curing the filler 70 may be performed before the process of attaching the light-providing unit 100 and the light-converting unit 300 together is performed. When the light-providing unit 100 and the light-converting unit 300 are attached together, the light-providing unit 100 may be disposed unintentionally close to the light-converting unit, such that the gap is smaller than thickness of the filler 70. When this happens, even if the filler 70 is cured, the filler 70 may not be sufficient enough to prevent contact and/or collision between the light-providing unit 100 and the light-converting unit 300 during the process of attaching them together. As a result, the organic light-emitting elements ED1, ED2 and ED3 and the wavelength conversion patterns 351 and 352, which are vulnerable to shock, may be damaged.

In contrast, when the first light-blocking pattern 360 of the exemplary embodiment is configured to maintain the gap between the light-providing unit 100 and the light-converting unit 300 during the attaching process, damage to the units due to contact and/or collision may be prevented. The first light-blocking pattern 360 may have an appropriate strength so that it is not damaged at the time of contact and/or collision between the light-providing unit 100 and the light-converting unit 300.

Referring back to FIGS. 2 to 4, the lower surface of the first light-blocking pattern 360 may not be completely flat but may be curved upwardly as shown in FIG. 2. A concave shape extending away from the light-providing unit 100 may be formed at the center portion of the surface of the first light-blocking pattern 360. The concave shape may be partially due to the level difference between the in-between areas and the areas where the optical patterns 351, 352, and 353 are disposed. However, exemplary embodiments of the present inventive concepts are not limited thereto. For example, the protruding surface of the first light-blocking pattern 360 may be substantially flat.

The display device 1 may further include a sealing member for coupling the light-providing unit 100 with the light converting portion 300 at the edge of the display device 1. The sealing member may include an organic material such as an epoxy resin.

Referring back to FIGS. 2 to 4, the filler 70 may be disposed between the light-providing unit 100 and the light-converting unit 300. The filler 70 may be disposed in the space surrounded by the light-providing unit 100, the light-converting unit 300 and the sealing member. The filler 70 is made of a material that may transmit light and can mitigate a shock. In an exemplary embodiment, the filler 70 may be made of an organic material. For example, in one exemplary embodiment, the filler 70 may be made of a silicon-based organic material, an epoxy-based organic material, an acrylic-based organic material, etc.

The filler 70 may be partially in contact with the thin encapsulation layer 170 and the first base substrate 110 of the light-providing unit 100 and with the second capping layer 342 and the first light-blocking pattern 360 of the light-converting unit 300.

The filler 70 may provide a flat surface over the optical patterns 351, 352 and 353 and the first light-blocking pattern 360 having the level differences. The filler 70 may be made of the material that may mitigate a shock and thus may serve as a buffering member that absorbs a shock generated between the light-providing unit 100 and the light-converting unit 300. The filler 70 may have a sufficient thickness to maintain the gap between the light-providing unit 100 and the light-converting unit 300 to serve as a buffering member. For example, the filler 70 may have a minimum thickness TH1 between the surface of the first light-blocking pattern 360 and the light-providing unit 100, as shown in FIG. 2. As long as the filler 70 maintains the minimum thickness TH1, it is possible to prevent the first light-blocking pattern 360 and/or the elements of the light-providing unit 100 from being worn or damaged as the first light-blocking pattern 360 comes in contact with and/or collides with the light-providing unit 100 thereunder after the attaching process. The minimum thickness TH1 may be approximately 2 to 5 µm.

Hereinafter, another exemplary embodiment of the present disclosure will be described. In the following description, the same or similar elements will be denoted by the same or similar reference numerals, and redundant descriptions will be omitted or briefly described.

Figure 6:
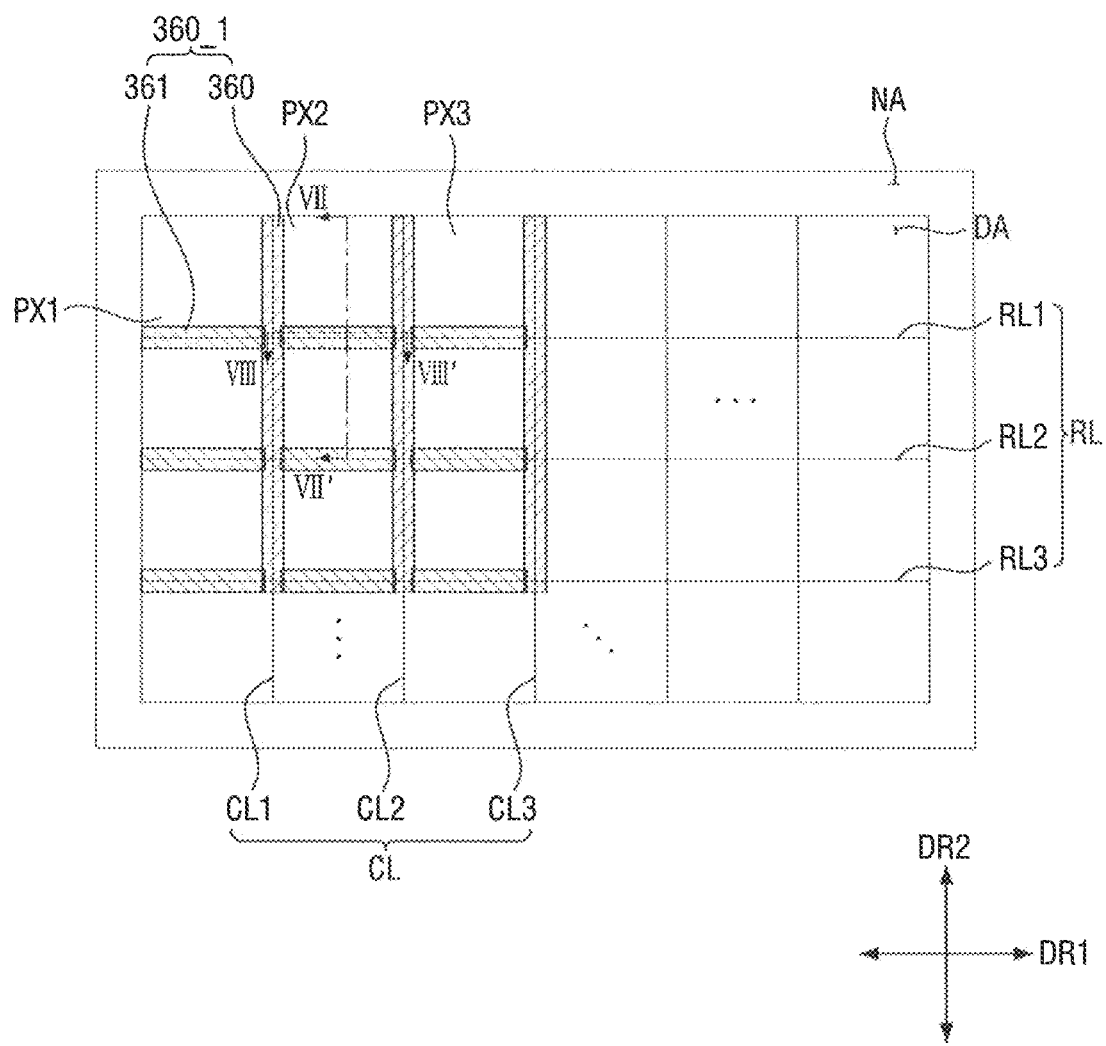
FIG. 6 is a plan view showing a layout of pixels and a light-blocking pattern of a display device according to another exemplary embodiment of the present inventive concepts.
Figure 7:
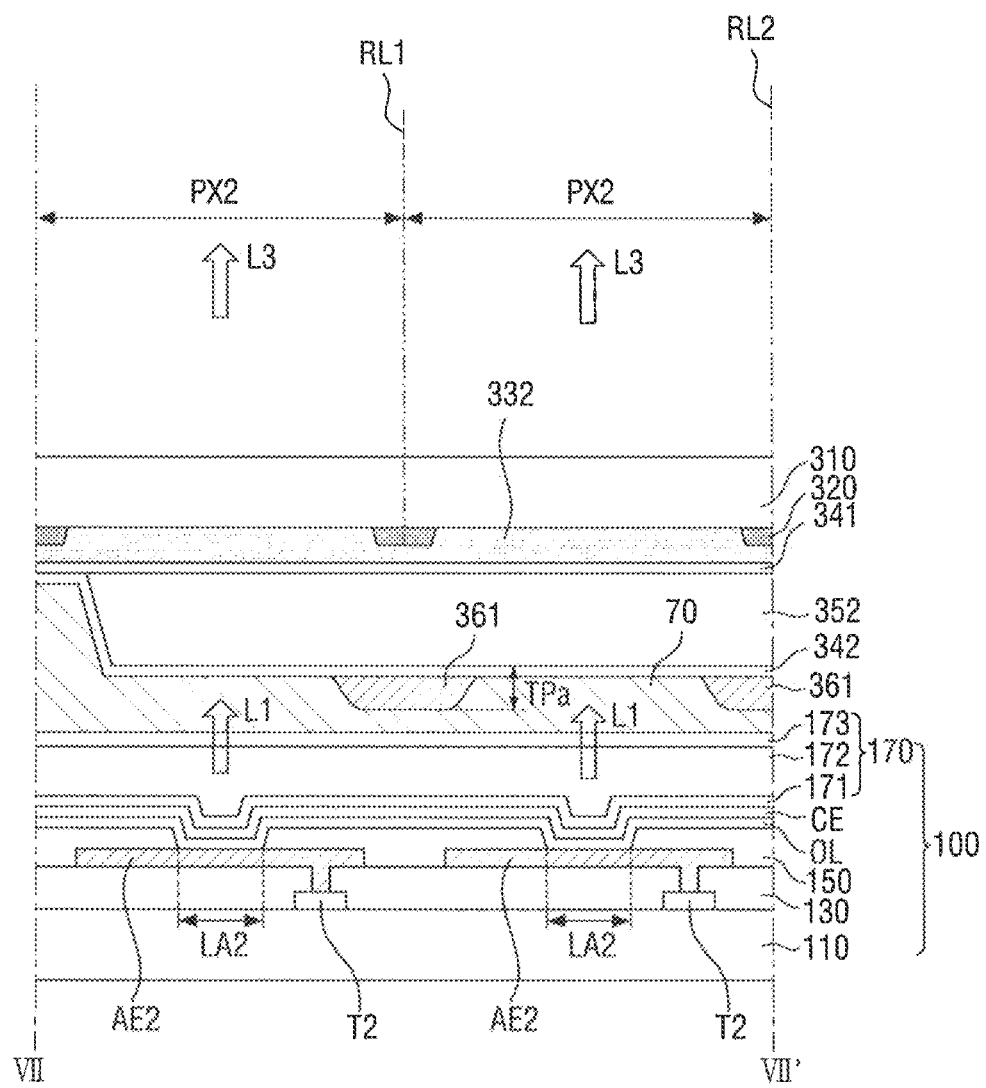
FIG. 7 is a cross-sectional view of a display device taken along line VII-VII' of FIG. 6 according to an exemplary embodiment of the present inventive concepts.
Figure 8:
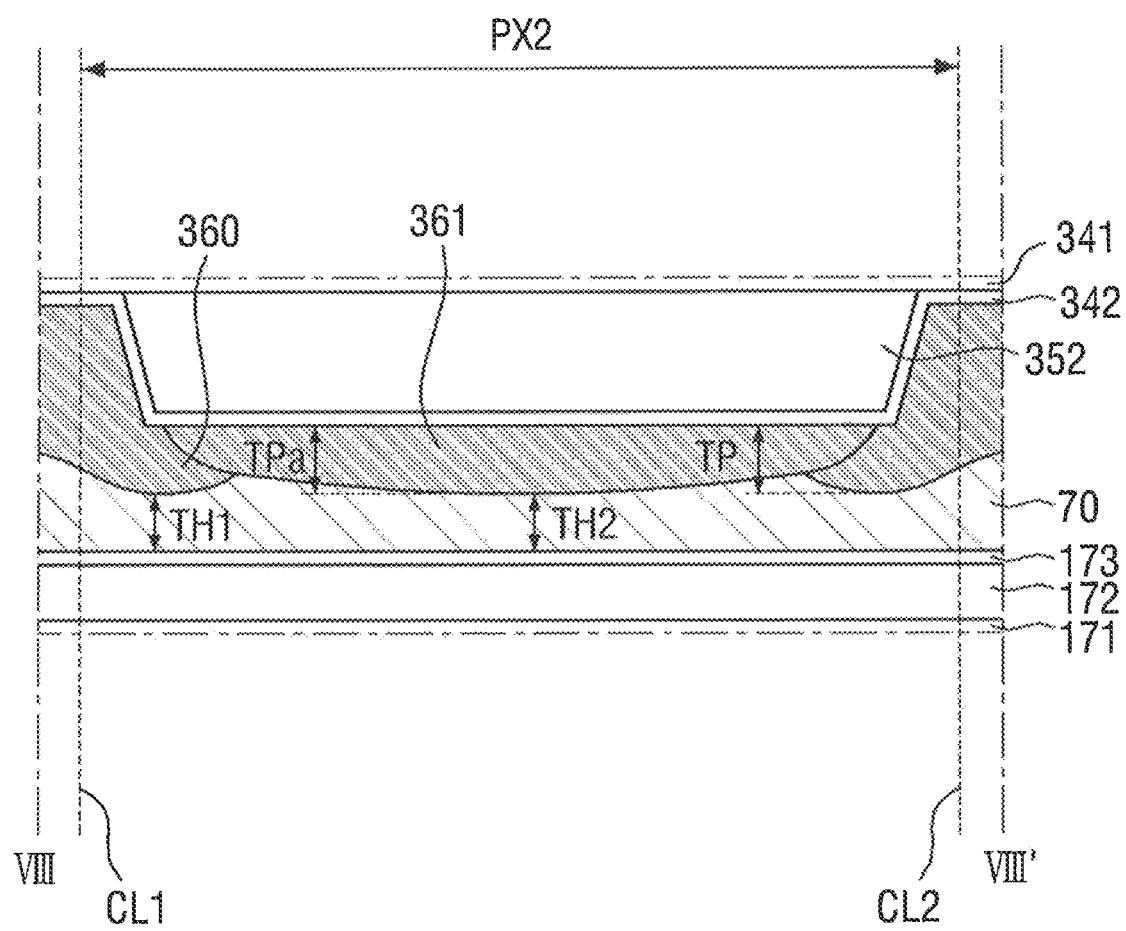
FIG. 8 is a cross-sectional view of the display device taken along line VIII-VIII' of FIG. 6 according to an exemplary embodiment of the present inventive concepts.

FIG. 6 is a plan view showing a layout of pixels and a first light-blocking pattern of a display device according to another exemplary embodiment of the present inventive concepts. FIG. 7 is a cross-sectional view of a display device according to an exemplary embodiment of the present inventive concepts taken along line VII-VII' of FIG. 6. FIG. 8 is a cross-sectional view of the display device according to an exemplary embodiment of the present inventive concepts taken along line VIII-VIII' of FIG. 6.

Referring to FIGS. 6 to 8, a first light-blocking pattern 360_1 according to the exemplary embodiment of the present disclosure may be different from the first light-blocking pattern 360 according to the exemplary embodiment shown in FIG. 1 due to the inclusion of a subsidiary light-blocking pattern 361 disposed at pixel row boundaries RL1 and RL2.

Specifically, the subsidiary light-blocking pattern 361 may be disposed between adjacent lines of the first light-blocking pattern 360 when viewed from the top.

The subsidiary light-blocking pattern 361 may include substantially the same material as the first light-blocking pattern 360.

The subsidiary light-blocking pattern 361 may not block the light emitted from the emission area and the light converted in the optical patterns 351, 352 and 353 from traveling in the side direction, unlike the first light-blocking pattern 360.

The subsidiary light-blocking pattern 361 may be disposed on each of the optical patterns 351, 352, and 353. The width of the subsidiary light-blocking pattern 361 may be smaller than the width of each of the optical patterns 351, 352 and 353 when viewed from the top. The subsidiary light-blocking pattern 361 may be disposed on each of the optical patterns 351, 352 and 353 that are extended in the column direction. Accordingly, the surface of the subsidiary light-blocking pattern 361 may not include a concave shape away from the first light-blocking pattern 360 and the light-providing unit 100 but may have a substantially curved shape.

The lines of the subsidiary light-blocking pattern 361 may be extended along the pixel column boundaries CL1, CL2 and CL3 and may be in direct contact with and connected to the ends of the adjacent lines of the first light-blocking pattern 360.

Each line of the subsidiary light-blocking pattern 361 may be connected to the adjacent lines of the first light-blocking pattern 360 at both sides. Accordingly, when viewed from the top, the first light-blocking pattern 360_1 may have a lattice shape in which the first light-blocking pattern 360 and the subsidiary light-blocking pattern 361 are integrally connected to each other and are arranged along the pixel row boundaries RL and the pixel column boundaries CL.

Each of the subsidiary light-blocking pattern 361 and the first light-blocking pattern 360 may have maximum protrusion thicknesses TP and TP1 from the surface of the optical patterns 351, 352 and 353.

The first light-blocking pattern 360_1 may be formed via a photolithography process. In an exemplary embodiment, a second light-blocking pattern material may be applied onto the second base substrate 310 on which the optical patterns 351, 352, and 353 are disposed. The second light-blocking pattern material may be an opaque organic material as described above with respect to the second light-blocking pattern.

As described above, there may be a level difference between the areas where the optical patterns 351, 352 and 353 are disposed and the in-between areas. Accordingly, the surface height of the areas where the optical patterns 351, 352 and 353 are disposed may be larger than the surface height of the in-between areas. Therefore, the surface height of the second light-blocking pattern material layer that forms the subsidiary light-blocking pattern 361 may become larger than the surface height of the second light-blocking pattern material layer forming the first light-blocking pattern 360. A part of the second light-blocking pattern material layer disposed on the optical patterns 351, 352 and 353 may move to adjacent areas (the areas where the optical patterns 351, 352 and 353 are not disposed) and thus the surface height may be lowered. However, the height of the second light-blocking pattern material disposed on the optical patterns 351, 352, 353 may be larger than the surface height of the second light-blocking pattern material layer located in the in-between areas.

As described above, the filler 70 may maintain the minimum thickness between the surface of the first light-blocking pattern 360_1 and the light-providing unit 100 to prevent damage due to contact and/or collision between the first light-blocking pattern 360_1 and the light-providing unit 100 during the attaching process, etc. If the surface height of the second light-blocking pattern material layer forming the subsidiary light-blocking pattern 361 becomes larger than the surface height of the second light-blocking pattern material layer forming the first light-blocking pattern 360, the overall thickness of the filler 70 may be increased to maintain the minimum thickness between the surface of the subsidiary light-blocking pattern 361 having a larger surface height than the first light-blocking pattern 360 and the light-providing unit 100. This may deteriorate the light transmittance of the display device 2.

In view of the above, according to the exemplary embodiment of the present disclosure, a light-adjusting mask apparatus M may be utilized to adjust the surface height of the first light-blocking pattern 360_1 from area to area to make the surface height of the light-blocking pattern 360 from the surface of the optical patterns 351, 352 and 353 equal to the surface height of the subsidiary light-blocking pattern 361 therefrom. More detailed description thereon will be made with reference to FIGS. 9 to 11.

Figure 9:
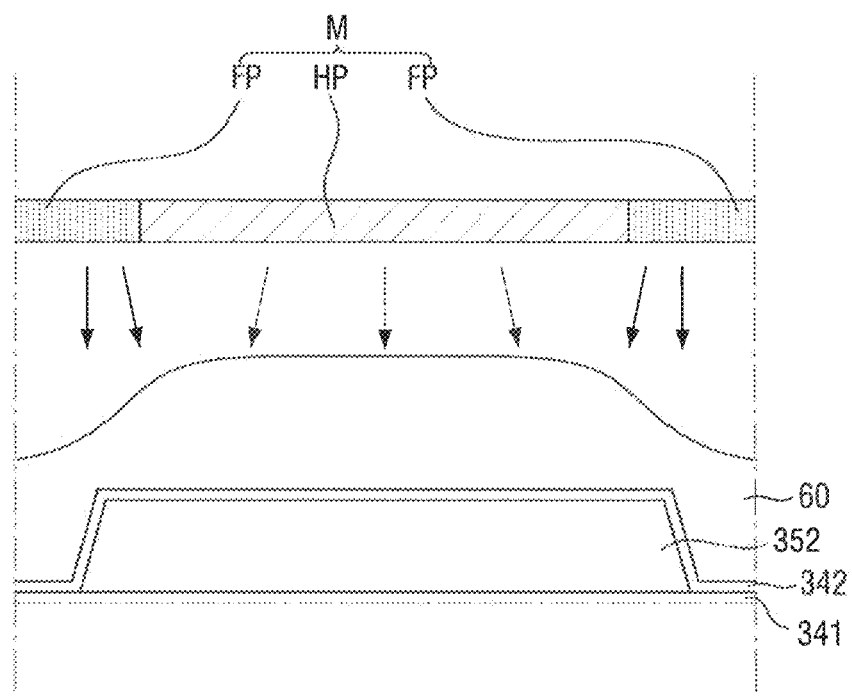
FIGS. 9 to 10 are elevational views illustrating a method for fabricating a light-blocking pattern according to an exemplary embodiment of the present inventive concepts.
Figure 10:
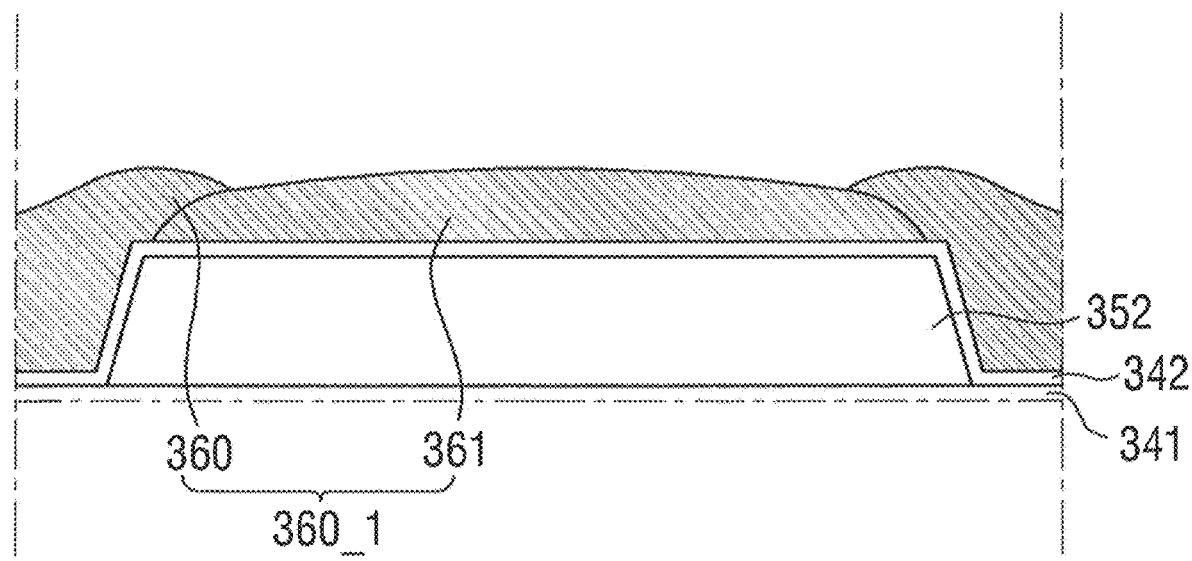
Figure 11:
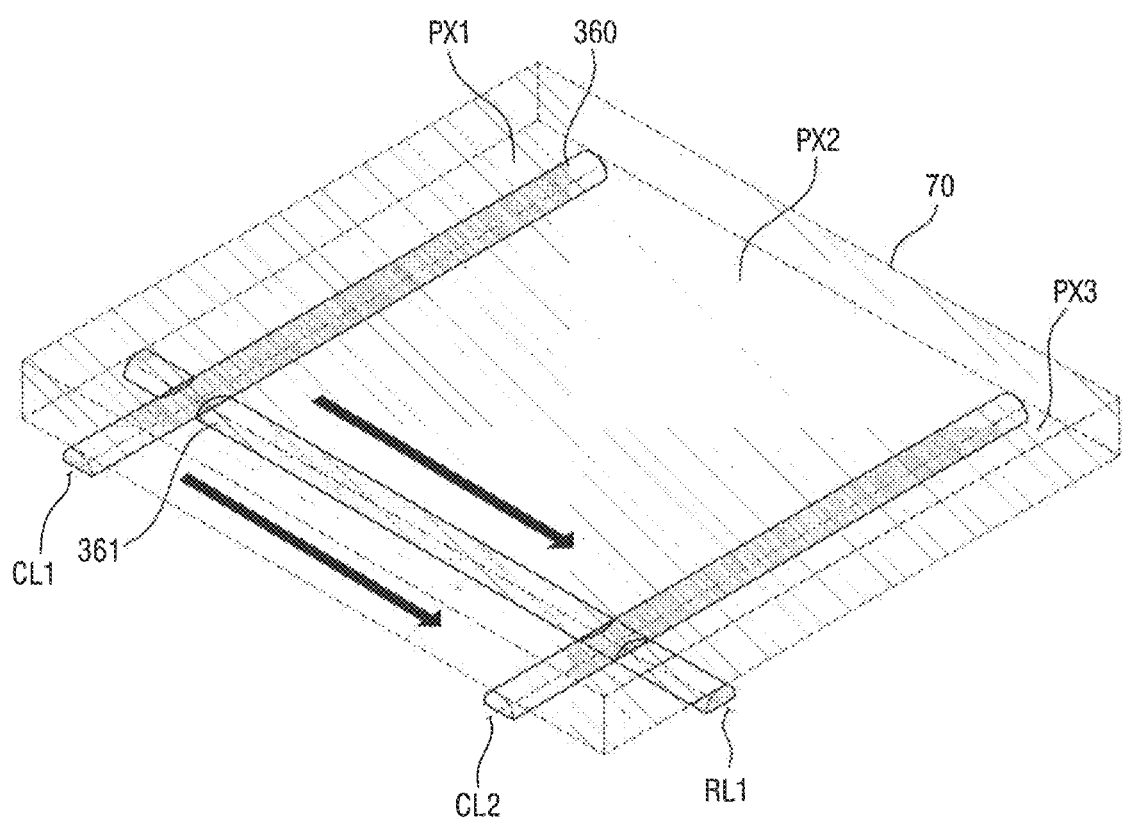
FIG. 11 is a perspective view illustrating a method for fabricating a light-blocking pattern according to an exemplary embodiment of the present inventive concepts.

FIGS. 9 to 10 are elevational views illustrating a method for fabricating a light-blocking pattern according to an exemplary embodiment of the present inventive concepts. FIG. 11 is a perspective view illustrating a method for fabricating a light-blocking pattern according to an exemplary embodiment of the present inventive concepts.

Referring to FIGS. 9 to 11, a first light-blocking pattern 360_1 according to the exemplary embodiment of the present inventive concepts may be formed by using a light-adjusting mask apparatus M capable of adjusting the thickness from area to area. The light-adjusting mask apparatus M may be a halftone mask or a slit mask. In the following description, a halftone mask may be employed as the light-adjusting mask apparatus M as an example.

Referring to FIG. 9, the light-adjusting mask apparatus M may be placed above a second light-blocking pattern material layer 60 that has been deposited on the optical patterns 351, 352, 353 and has a level difference between the areas where optical patterns are disposed and the in-between areas.

The second light-blocking material layer 60 may include a negative photoresist material (negative PR). However, the present disclosure is not limited thereto and other materials may be utilized for the second light-blocking material layer. For example, the second light-blocking pattern material layer 60 may include a positive photoresist (PR). In the following description, the second light-blocking pattern material layer 60 includes a negative photoresist material (negative PR).

The light-adjusting mask apparatus M may include a transmissive portion FP which transmits light, and a transflective portion HP which blocks transmission of some light. As shown in FIG. 9, the transflective portion HP of the light-adjusting mask apparatus M may be disposed above the second light-blocking pattern material layer 60 on the optical patterns 351, 352 and 353, and the transmissive portion FP of the light-adjusting mask apparatus M may be disposed above the second light-blocking pattern material layer 60 not on the optical patterns 351, 352 and 353. The transmissive portions FP may be disposed adjacent to each other with the transflective portion HP therebetween.

It should be noted that when a positive photoresist material is employed as the second light-blocking pattern material layer 60, the positions of the transflective portion HP and the transmissive portion FP may be switched.

Subsequently, irradiation light such as UV ultraviolet ray and CW laser used for a typical patterning process may be irradiated from above the light-adjusting mask apparatus M.

In the region where the transmissive portion FP of the light-adjusting mask apparatus M is placed, the irradiation light passes through the transmissive portion FP and is irradiated onto the second light-blocking pattern material layer 60. In the region where the light transflective portion HP of the light-adjusting mask apparatus M is placed, at least a part of the light passes through the transflective portion HIP and is irradiated onto the second light-blocking material layer 60. Accordingly, the portion of the second light-blocking material layer 60 under the transmissive portion FP may be developed and etched more than the portion of the second light-blocking material layer 60 under the transflective portion HP. Accordingly, as can be seen from FIG. 10 showing the final structure, the difference in the surface protruding heights TP and TPa between the first light-blocking pattern 360 under the transmissive portion FP and the subsidiary light-blocking pattern 361 under the transflective portion HP may be between approximately 0.8 and 1.2. In order to avoid the thickness of the filler 70 from increasing, the surface protruding heights TP and TPa thereof may be substantially equal to each other.

The filler 70 may have the same minimum thicknesses TH1 and TH2 in the areas where the first light-blocking pattern 360 is disposed and the areas where the subsidiary light-blocking pattern 361 is disposed. Accordingly, it is possible to avoid the thickness of the filler 70 from increasing in the areas overlapping the subsidiary light-blocking pattern 361, thereby preventing the light transmittance from being unnecessarily lowered.

Subsequently, referring to FIG. 11, a filler 70 may be formed over the second base substrate on which the first light-blocking pattern 360_1 is disposed. The filler 70 may be disposed over the entire surface of the second base substrate.

The first light-blocking pattern 360_1 disposed along the pixel row boundaries RL1, RL2 and RL3 and the pixel column boundaries CL1, CL2 and CL3 may guide the direction in which the filler 70 flows. Specifically, the first light-blocking pattern 360 may guide the filler 70 so that it flows in the pixel column direction, and the subsidiary light-blocking pattern 361 may guide the filler 70 so that it flows in the pixel row direction.

As a result, the filler 70 can move in the pixel row direction so that it may evenly spread across the pixels PX1, PX2 and PX3. Therefore, the subsidiary light-blocking pattern 361 may prevent defects that may occur when the space on the second substrate is not completely filled with the filler 70.

Like the first light-blocking pattern 360, the subsidiary light-blocking pattern 361 may maintain the gap between the light-providing unit 100 and the light-converting unit 300 during the attaching process, so that it is possible to prevent them from being damaged by contact and/or collision.

Figure 12:
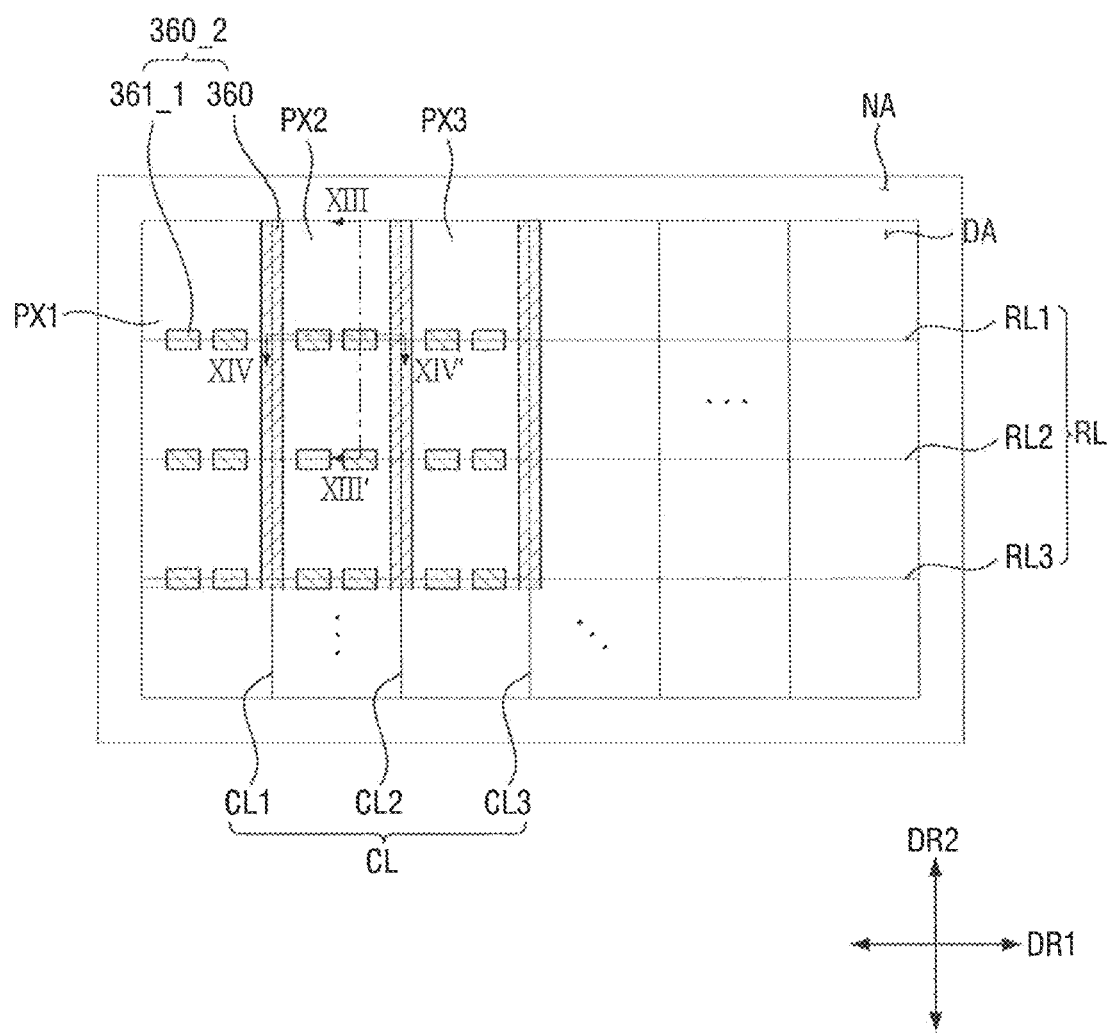
FIG. 12 is a plan view showing a layout of pixels and a light-blocking pattern of a display device according to yet another exemplary embodiment of the present inventive concepts.
Figure 13:
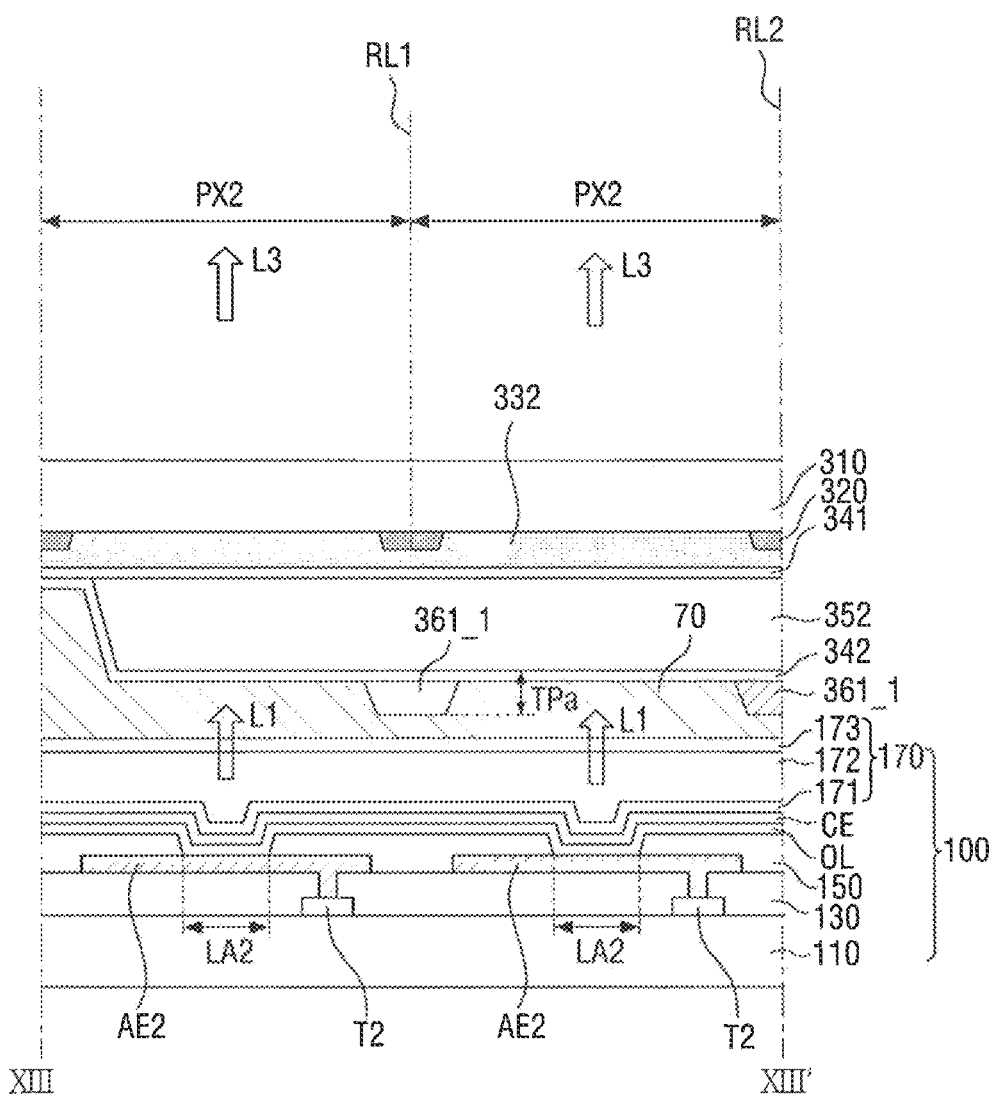
FIG. 13 is a cross-sectional view of the display device taken along line XIII-XIII' of FIG. 12 according to an exemplary embodiment of the present inventive concepts.
Figure 14:
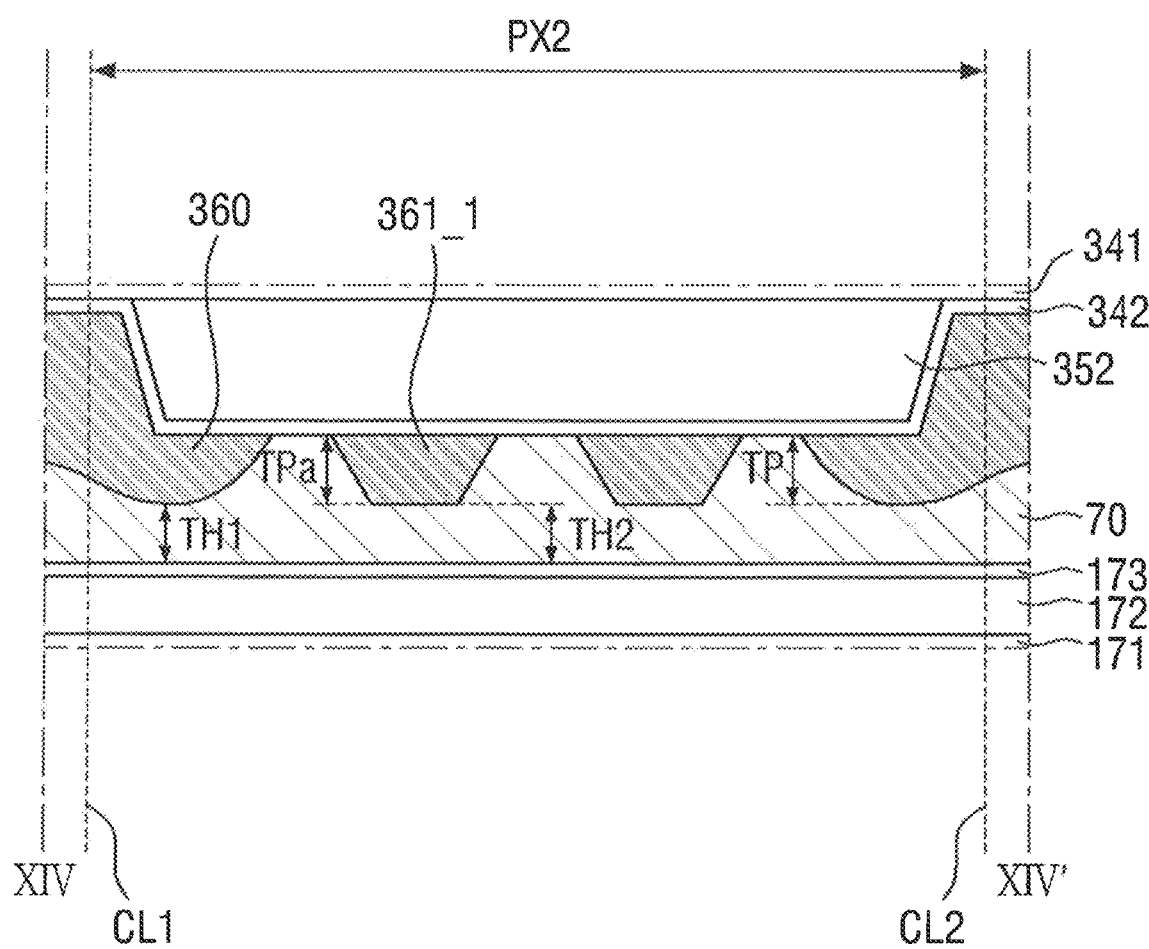
FIG. 14 is a cross-sectional view of the display device taken along line XIV-XIV' of FIG. 12 according to an exemplary embodiment of the present inventive concepts.
Figure 15:
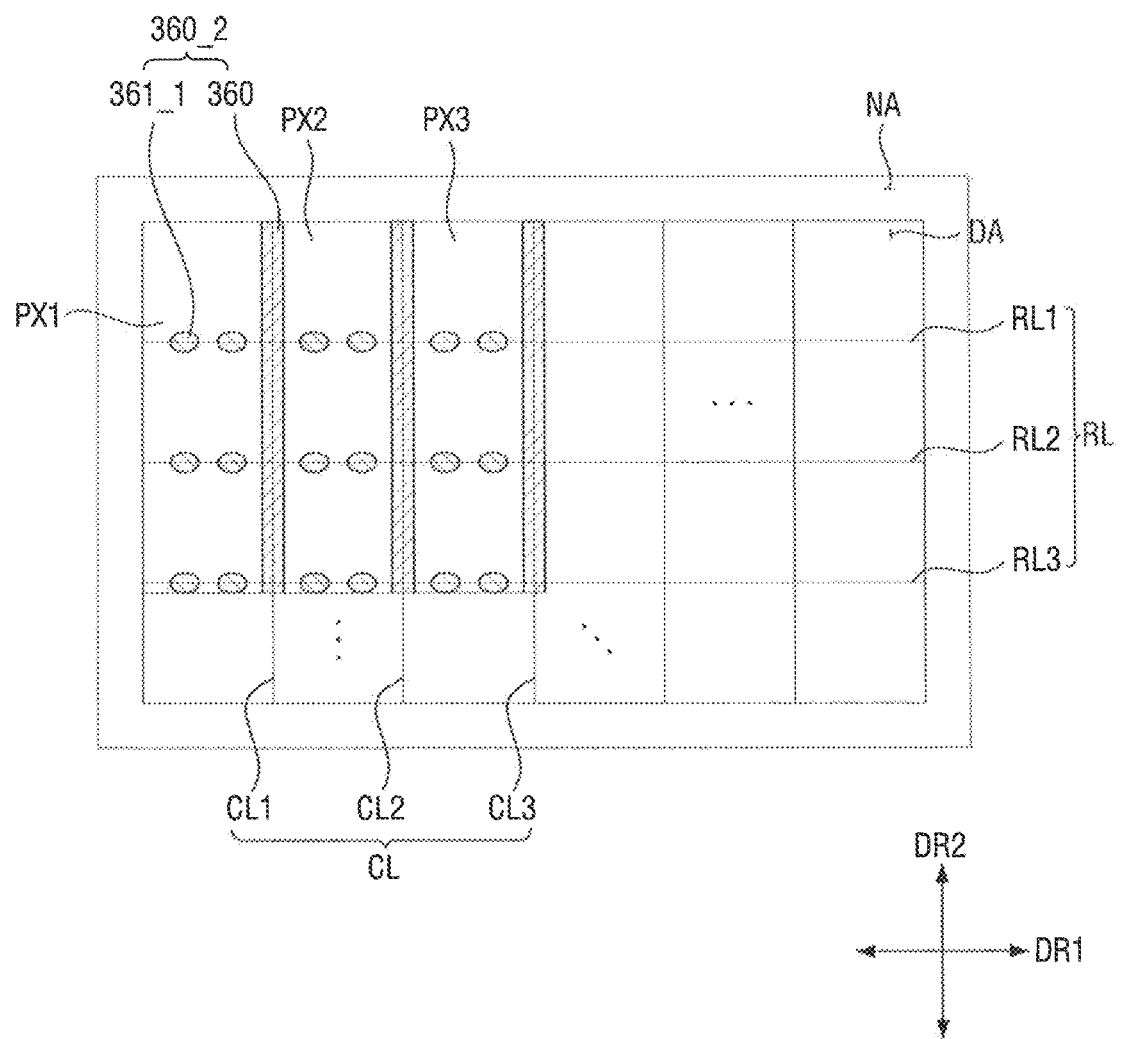
FIG. 15 is a plan view showing a layout of pixels and a light-blocking pattern which includes a modification of the exemplary embodiment of FIG. 12.

FIG. 12 is a plan view showing a layout of pixels and a first light-blocking pattern of a display device according to yet another exemplary embodiment of the present inventive concepts. FIG. 13 is a cross-sectional view of the display device according to the exemplary embodiment of the present inventive concepts taken along line XIII-XIII' of FIG. 12. FIG. 14 is a cross-sectional view of the display device according to the exemplary embodiment of the present inventive concepts taken along line XIV-XIV' of FIG. 12. FIG. 15 is a plan view showing a layout of pixels and a light-blocking pattern which includes a modification of the exemplary embodiment of FIG. 12.

A first light-blocking pattern 360_2 according to the exemplary embodiment of the present disclosure may be different from the exemplary embodiment shown in FIGS. 7 and 8 in that a subsidiary light-blocking pattern 361_1 may be separated from a first light-blocking pattern 360.

More specifically, unlike the subsidiary light-blocking pattern 361 according to the exemplary embodiment shown in FIGS. 7 and 8, a plurality of island-like subsidiary light-blocking patterns 361_1 may be disposed between adjacent lines of the first light-blocking patterns 360. The subsidiary light-blocking patterns 361_1 may be separated from one another and from the adjacent lines of the first light-blocking patterns 360.

As the subsidiary light-blocking patterns 361_1 according to this exemplary embodiment are arranged in a plurality of island shapes, the area thereof may be reduced somewhat as compared to the subsidiary light-blocking pattern 361 according to FIGS. 7 and 8. As a result, the buffering effect of the subsidiary light-blocking patterns 361_1 may be enhanced. For example, as the size of the subsidiary light-blocking patterns 361_1 are reduced when viewed from the top, the flexibility of each subsidiary light-blocking pattern 361_1 may be improved and accordingly the overall flexibility of the first light-blocking pattern 360_2 may be improved. Accordingly, the subsidiary light-blocking pattern 361_2 may effectively mitigate shock when the light-providing unit 100 comes in contact with and/or collides with the light-converting unit 300, and prevent damage to the organic light-emitting elements and/or the optical patterns which are vulnerable to an external shock.

However, the present disclosure is not limited thereto. For example, some of the subsidiary light-blocking patterns 361_1 may be separated from one another whereas the subsidiary light-blocking patterns 361_1 adjacent to the first light-blocking pattern 360 may be connected to the first light-blocking pattern on both sides thereof. In this embodiment, the overall size of the first light-blocking pattern 360_2 may still be reduced when viewed from the top.

The shape of the subsidiary light-blocking patterns 361_1 may be a rectangle when viewed from the top. However, exemplary embodiments of the present inventive concepts are not limited thereto. For example, the shape of the subsidiary light-blocking patterns 361_1 may be circular or elliptical, as shown in FIG. 15.

The width of the subsidiary light-blocking pattern 361_1 may be equal to the width of the first light-blocking pattern 360 when viewed from the top. However, exemplary embodiments of the present inventive concepts are not limited thereto. For example, the width of the subsidiary light-blocking pattern 361_1 may be greater than or smaller than the width of the first light-blocking pattern 360.

The maximum protruding thickness TPa of the subsidiary light-blocking pattern 361_1 may be equal to the maximum protruding thickness TP of the first light-blocking pattern 360, like the subsidiary light-blocking pattern 361 shown in FIGS. 6 and 7.

The filler 70 may have the same minimum thicknesses TH1 and TH2 in the areas where the first light-blocking pattern 360 may be disposed and the areas where the subsidiary light-blocking pattern 361_1 may be disposed. Accordingly, the thickness of the filler 70 may not need to be increased in the areas overlapping the subsidiary light-blocking pattern 361_1, thereby preventing the light transmittance from being unnecessarily lowered.

Further, the subsidiary light-blocking pattern 361_1 arranged along the pixel row boundaries RL1, RL2 and RL3 may guide the direction in which the filler 70 flows, so that the filler 70 may move in the pixel row direction and evenly spread across the pixels PX1, PX2 and PX3. Therefore, the subsidiary light-blocking pattern 361 may prevent defects caused when the second substrate is not completely filled with the filler 70.

Figure 16:
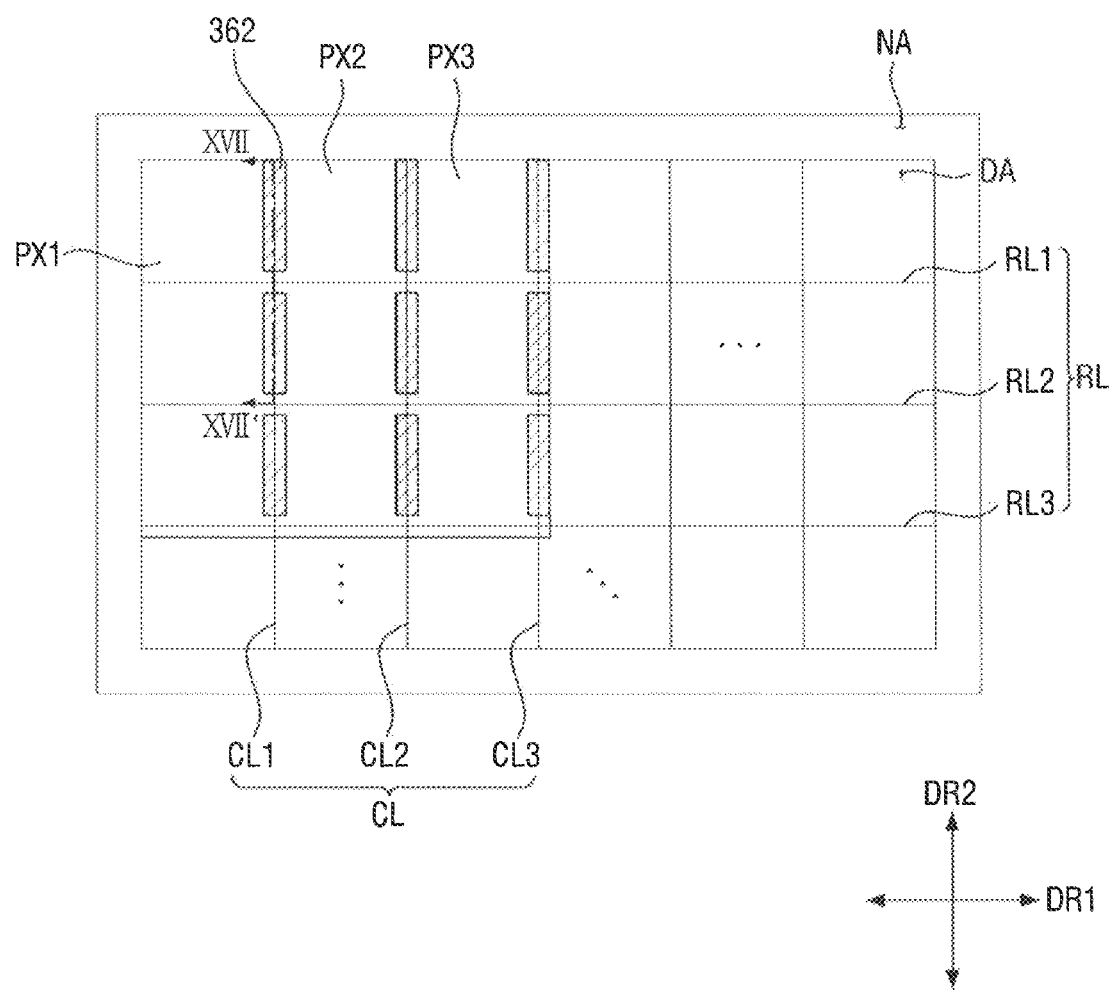
FIG. 16 is a plan view showing a layout of pixels and a light-blocking pattern of a display device according to yet another exemplary embodiment of the present inventive concepts.
Figure 17:
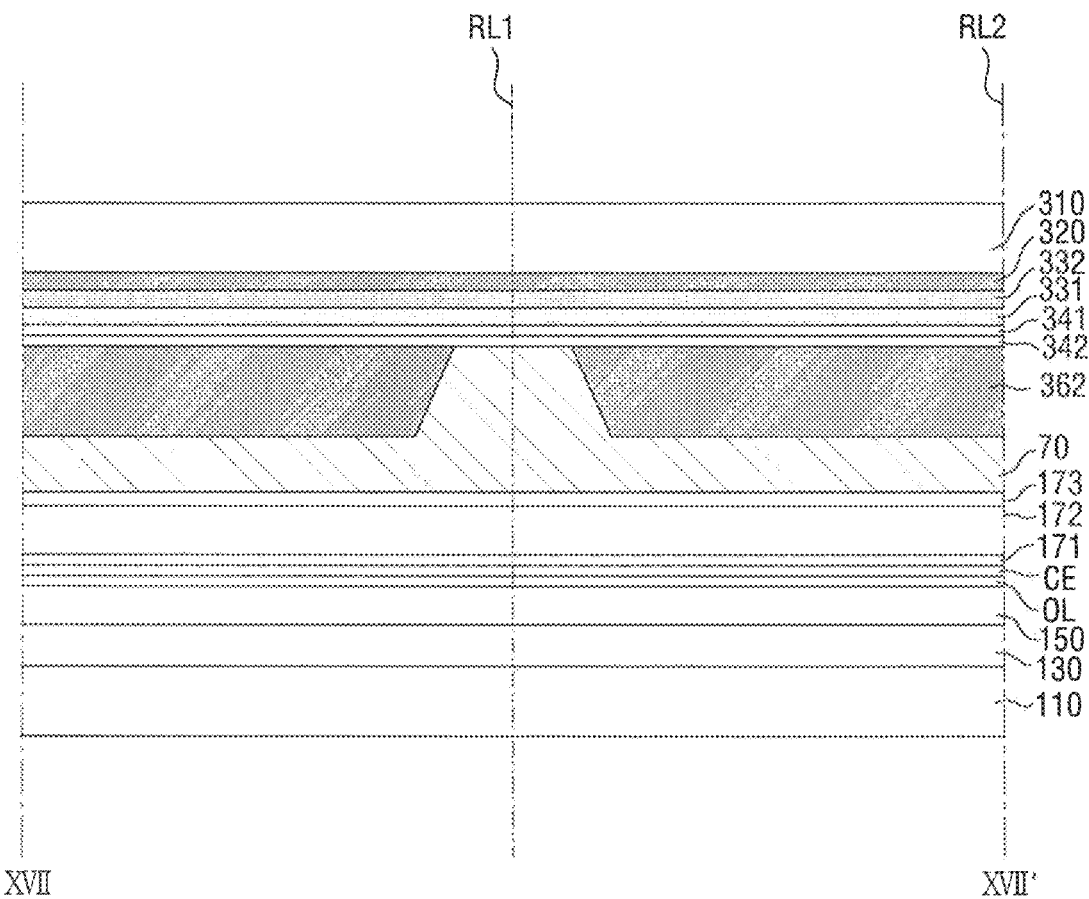
FIG. 17 is a cross-sectional view of the display device taken along line XVII-XVII' of FIG. 16 according to an exemplary embodiment of the present inventive concepts.

FIG. 16 is a plan view showing a layout of pixels and a first light-blocking pattern of a display device according to yet another exemplary embodiment of the present disclosure. FIG. 17 is a cross-sectional view of the display device according to the exemplary embodiment of the present disclosure, taken along line XVII-XVII' of FIG. 16.

Referring to FIGS. 16 and 17, a first light-blocking pattern 362 according to the exemplary embodiment may be different from the first light-blocking pattern 360 according to the exemplary embodiment shown in FIGS. 1 to 4 due to lines of the first light-blocking pattern 362 being separated from one another.

More specifically, the first light-blocking pattern 362 may be extended along the pixel column boundaries CL1, CL2 and CL3 but may not be disposed at the intersections with the pixel row boundaries RL1, RL2 and RL3.

As the first light-blocking pattern 362 according to the exemplary embodiment has the island shape arranged separately from one another, the buffering effect of the first light-blocking pattern 362 may be enhanced. More specifically, as the size of the first light-blocking pattern 362 is reduced when viewed from the top, the flexibility of each line of the first light-blocking pattern 362 may be improved. As a result, the shock caused by the contact and/or the collision between the light-providing unit 100 and the light-converting unit 300 may be effectively mitigated by the first light blocking pattern 362 to prevent damage to the organic light-emitting elements and/or the optical patterns which are vulnerable to external shock.

Figure 18:
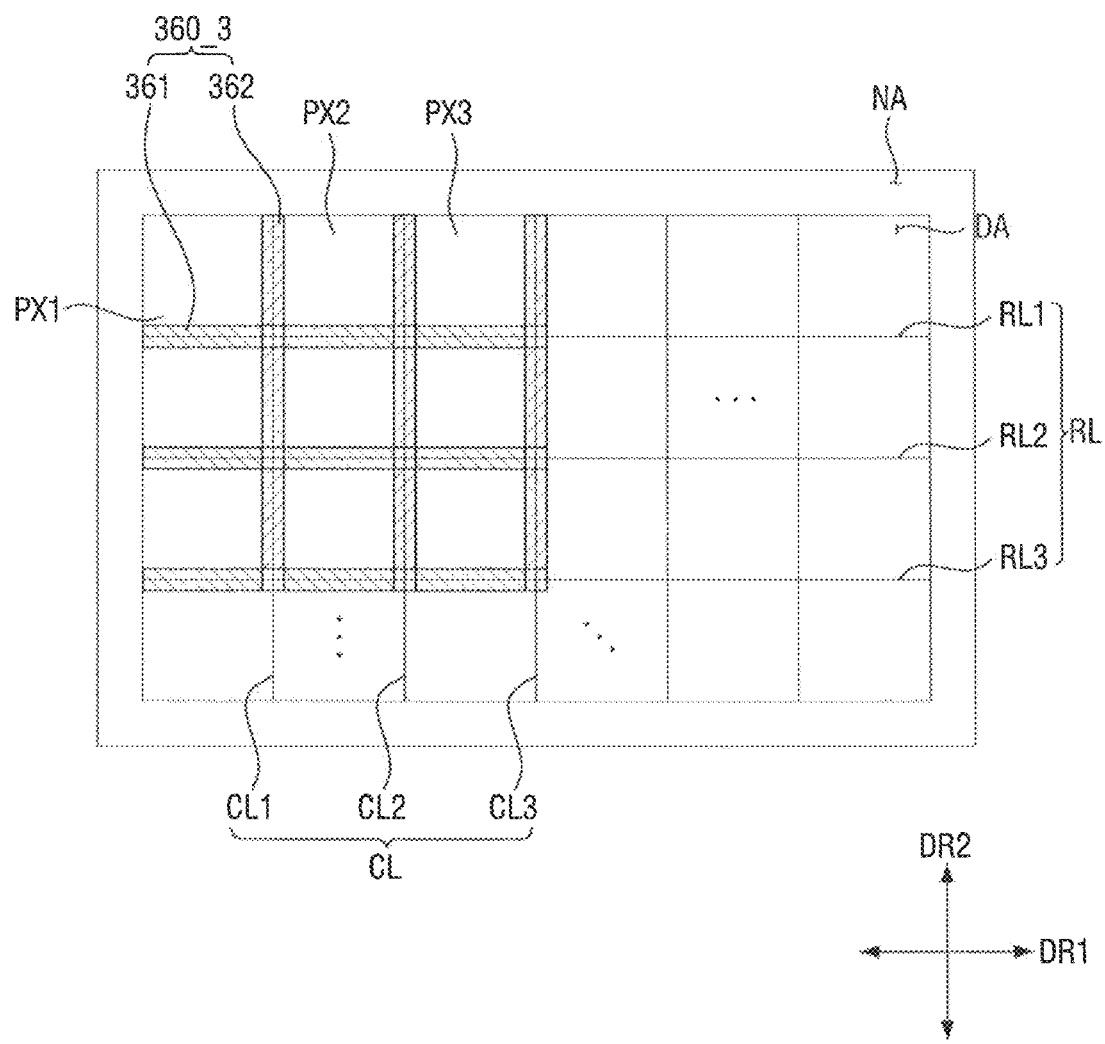
FIG. 18 is a plan view showing a layout of pixels and a light-blocking pattern of a display device according to yet another exemplary embodiment of the present inventive concepts.

FIG. 18 is a plan view showing a layout of pixels and a first light-blocking pattern of a display device according to yet another exemplary embodiment of the present inventive disclosures.

Referring to FIG. 18, a first light-blocking pattern 360_3 according to the exemplary embodiment shown in FIG. 18 is different from the first light-blocking pattern 362 according to the exemplary embodiment shown in FIGS. 16 and 17 due to the inclusion of the subsidiary light-blocking pattern 361 according to the exemplary embodiment of FIGS. 7 and 8.

More specifically, the first light-blocking pattern 362 may be extended along the pixel column boundaries CL1, CL2 and CL3 but may not be disposed at the intersections with the pixel row boundaries RL1. RL2 and RL3. The subsidiary light-blocking pattern 361 may be disposed at the intersections with the pixel row boundaries RL1, RL2 and RL3 but may not be disposed at the intersections with the pixel column boundaries CL1, CL2 and CL3. The subsidiary light-blocking pattern 361 may be disposed between adjacent lines of the first light-blocking pattern 362 when viewed from the top.

Figure 19:
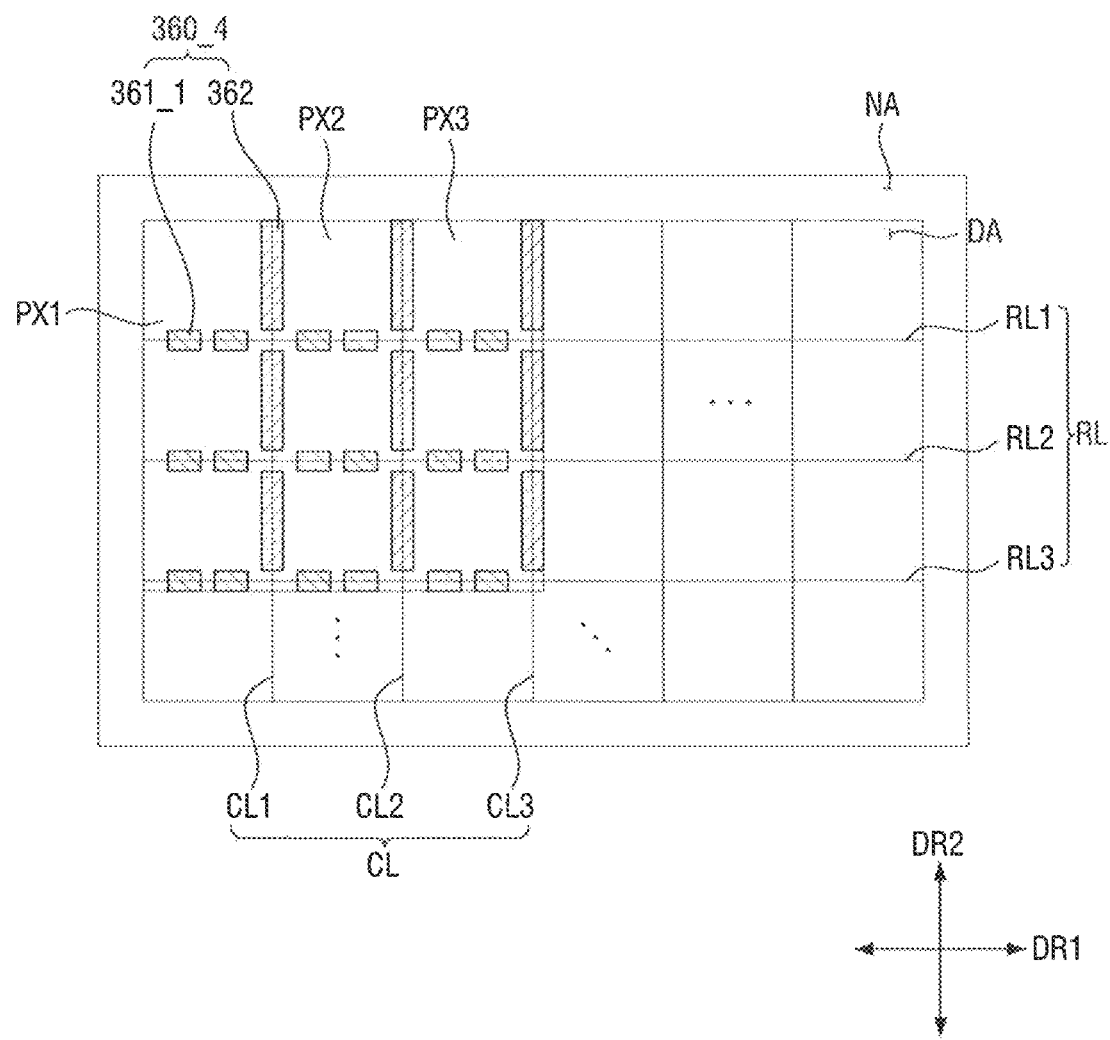
FIG. 19 is a plan view showing a layout of pixels and a light-blocking pattern of a display device according to yet another exemplary embodiment of the present inventive concepts.
Figure 20:
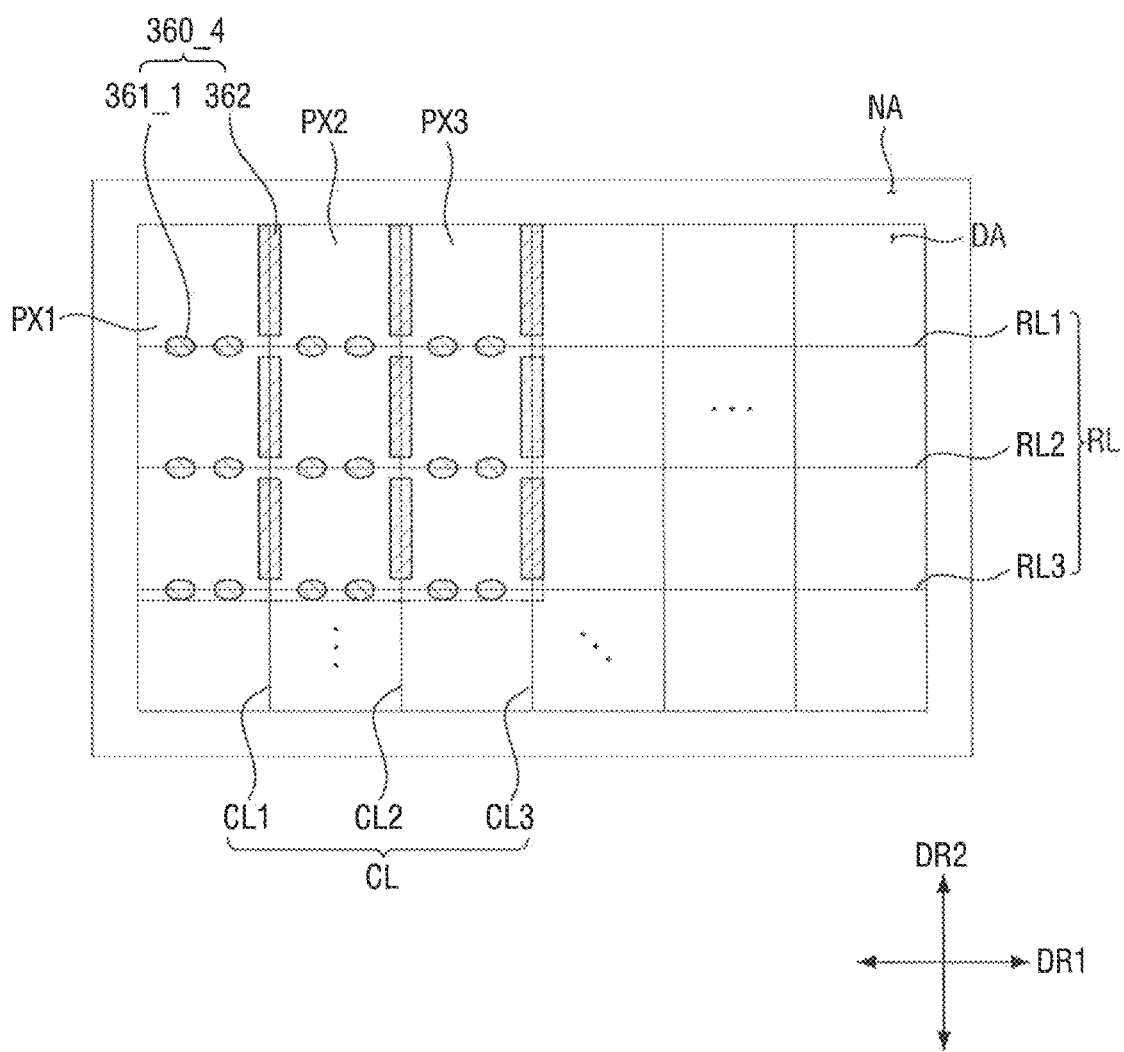
FIG. 20 is a plan view showing a layout of pixels and a light-blocking pattern of a display device according to yet another exemplary embodiment of the present inventive concepts.

FIG. 19 is a plan view showing a layout of pixels and a first light-blocking pattern of a display device according to yet another exemplary embodiment of the present inventive concepts. FIG. 20 is a plan view showing a layout of pixels and a first light-blocking pattern of a display device according to yet another exemplary embodiment of the present inventive concepts.

First light-blocking patterns 360_4 according to the exemplary embodiments shown in FIGS. 19 and 20 are different from the first light-blocking pattern 360_3 according to the exemplary embodiment shown in FIG. 18 due to the subsidiary light-blocking patterns 361 having the shapes shown in FIGS. 12 and 15 are employed.

More specifically, the first light-blocking pattern 362 may be extended along the pixel column boundaries CL1, CL2 and CL3 but may not be disposed at the intersections with the pixel row boundaries RL1, RL2 and RL3.

The subsidiary light-blocking pattern 361_1 may be disposed between adjacent lines of the first light-blocking pattern 360 in a plurality of island shapes. The subsidiary light-blocking patterns 361_1 may be separated from one another and from the adjacent lines of the first light-blocking patterns 360.

In concluding the detailed description, those skilled in the art will appreciate that many variations and modifications can be made to the preferred embodiments without substantially departing from the principles of the present invention. Therefore, the disclosed exemplary embodiments of the present inventive concepts are used in a generic and descriptive sense only and not for purposes of limitation.

What is claimed is:

1. A display device comprising, a plurality of pixels, the display device comprising:
   a. first substrate including light-emitting elements disposed in the plurality of pixels;
   a second substrate facing the first substrate;
   a plurality of optical patterns disposed on the second substrate and extending along in a first direction, each of the optical patterns spanning, across at least two of the pixels in the first direction; and
   light-blocking patterns disposed on the second substrate, wherein the light-blocking patterns comprise a main light-blocking pattern disposed in spaces between adjacent optical patterns, and a subsidiary light-blocking pattern disposed on the optical patterns and having a thickness smaller than a thickness of the main light-blocking pattern,
   wherein the lain light-blocking pattern contacts an entirety of a side surface of the adjacent optical patterns and partially covers a bottom surface of the adjacent optical patterns,
   the plurality of pixels are arranged in pixel rows extending in a row direction and pixel columns extending in a column direction crossing the row direction;
   the plurality of optical patterns are disposed on the second substrate in the pixel columns and extend along the column direction;
   the main light-blocking pattern extends along pixel column boundaries disposed between adjacent pixel columns; and
   the subsidiary light-blocking pattern is disposed on the optical patterns at pixel row boundaries disposed between adjacent pixel rows and spans at least from a first main light blocking pattern to an adjacent main light blocking pattern at the pixel row boundaries.

2. The display, device of claim 1,
wherein each of the optical patterns has a stripe shape when viewed from a top, and
wherein a surface height of the main light-blocking pattern from surface of the optical patterns is 0.8 to 1.2 times a surface height of the subsidiary light-blocking pattern.

3. The display device of claim 1, wherein the subsidiary light-blocking pattern is extended along the pixel row boundaries.

4. The display device of claim 2, wherein lines of the main light-blocking pattern and lines of the subsidiary light-blocking pattern that are adjacent to one another are connected to form a lattice shape when viewed from the top.

5. The display device of claim 1, wherein the plain light-blocking pattern protrudes from a surface of the optical patterns in a thickness direction.

6. The display device of claim 5, wherein a protruding thickness of the main light-blocking pattern from the surface of the optical patterns ranges from 1 μm to 5 μn.

7. The display device of claim 1, further comprising:
   an encapsulation layer covering the light-emitting elements; and
   a filler disposed between the encapsulation layer and the optical patterns.

8. The display device of claim 7, wherein the filler is in direct contact with the main light-blocking pattern at the pixel column boundaries.

9. The display device of claim 8, wherein the filler is in direct contact with the subsidiary light-blocking pattern at the pixel row boundaries.

10. The display device of claim 9, wherein the filler has a smallest thickness at areas where it overlaps with the light-blocking patterns.

11. The display device of claim 1, wherein each of the light-emitting elements emits blue light and the adjacent optical patterns are configured to receive the blue light and convert a wavelength of the blue light to emit light having different wavelengths.

12. A display device comprising a plurality of pixels arranged in pixel rows extending in a row direction and pixel columns extending in a column direction crossing the row direction, the display device comprising:
   a first substrate including light-emitting elements disposed in the pixels;
   a second substrate facing the first substrate;
   a plurality of optical patterns disposed on the second substrate in the pixel columns and extending along the column direction, each of the optical patterns spanning across at least two of the pixels in the column direction; and
   light-blocking patterns including a main light-blocking pattern disposed on the second substrate and extending along pixel column boundaries disposed between adjacent pixel columns, and a subsidiary light-blocking pattern disposed on the optical patterns, extending in a direction crossing an extending direction of the main light-blocking pattern and having a thickness smaller than a thickness of the main light-blocking pattern,
   wherein the light-blocking patterns are disposed between adjacent optical patterns and are configured to fill spaces therebetween,
   wherein the light-blocking patterns contact an entirety of a side surface of the adjacent optical patterns and partially cover a bottom surface of the adjacent optical patterns, and
   wherein the subsidiary light-blocking pattern spans at least from a first main light blocking pattern to an adjacent main light blocking pattern.

13. The display device of claim 12, further comprising:
ran encapsulation layer covering the light-emitting elements; and
a filler disposed between the encapsulation layer and the optical patterns,
wherein the filler is in direct contact with the light-blocking patterns at the pixel column boundaries.

14. The display, device of claim 12, wherein the main light-blocking pattern has a stripe shape integrally extended along the pixel column boundaries.

15. The display device of claim 12, wherein the main light-blocking pattern protrudes from a surface of the optical patterns in a thickness direction, and wherein protruding thickness of the main light-blocking pattern ranges from 1 µm to 5 µm.

* * * * *